US011879925B1

(12) United States Patent
Andres et al.

(10) Patent No.: US 11,879,925 B1
(45) Date of Patent: Jan. 23, 2024

(54) OVER THE AIR (OTA) CHIP TESTING SYSTEM

(71) Applicant: Johnstech International Corporation, Minneapolis, MN (US)

(72) Inventors: Mike Andres, Inver Grove Heights, MN (US); David Johnson, Minneapolis, MN (US); Jason Steinblock, Minneapolis, MN (US)

(73) Assignee: Johnstech International Corporation, Minneapolis, MN (US)

( * ) Notice: Subject to any disclaimer, the term of this patent is extended or adjusted under 35 U.S.C. 154(b) by 262 days.

(21) Appl. No.: 17/230,092

(22) Filed: Apr. 14, 2021

Related U.S. Application Data

(60) Provisional application No. 63/009,836, filed on Apr. 14, 2020.

(51) Int. Cl.
*G01R 29/10* (2006.01)
*H01L 21/67* (2006.01)
*H01Q 1/12* (2006.01)
*G01R 1/04* (2006.01)

(52) U.S. Cl.
CPC ............. *G01R 29/10* (2013.01); *G01R 1/045* (2013.01); *H01L 21/67288* (2013.01); *H01Q 1/125* (2013.01)

(58) Field of Classification Search
CPC ... G01R 29/10; G01R 1/045; H01L 21/67288; H01Q 1/125
See application file for complete search history.

(56) References Cited

U.S. PATENT DOCUMENTS

| 5,205,132 | A | | 4/1993 | Fu |
| 5,584,717 | A | * | 12/1996 | Radde ................ H05K 7/1023 439/330 |
| 6,313,651 | B1 | | 11/2001 | Hembree et al. |

(Continued)

FOREIGN PATENT DOCUMENTS

| JP | 2002-257900 A | 9/2002 |
| WO | 2019/133097 A1 | 7/2019 |

OTHER PUBLICATIONS

International Search Report and Written Opinion, International Patent Application No. PCT/US2021/027207, dated Aug. 26, 2021 (10 pages).

(Continued)

*Primary Examiner* — Stephanie E Bloss
*Assistant Examiner* — Michael A Harrison
(74) *Attorney, Agent, or Firm* — Hamre, Schumann, Mueller & Larson, P.C.

(57) ABSTRACT

A test apparatus for testing device under test (DUT) having an antenna located on the DUT is disclosed. The test apparatus includes: a housing, a socket configured to electrically connect the DUT to a load board, a gripper assembly configured to hold the DUT in place, a retractor configured to release the DUT from the gripper assembly, and an alignment plate configured to align the DUT with the socket. The gripper assembly includes a base and an extender, the base is attached to the housing, and the extender is configured to hold the DUT in place. When the retractor is disengaged from the extender, the extender is configured to hold the DUT in place. When the retractor is engaged with the extender, the extender is configured to release the DUT on the alignment plate.

20 Claims, 34 Drawing Sheets

(56) References Cited

U.S. PATENT DOCUMENTS

| | | |
|---|---|---|
| 6,839,029 B2 | 1/2005 | Mendolia et al. |
| 9,906,315 B1 | 2/2018 | Bartko et al. |
| 10,114,067 B2 | 10/2018 | Lam et al. |
| 2009/0153158 A1 | 6/2009 | Dunn et al. |
| 2009/0207036 A1 | 8/2009 | Ko et al. |
| 2012/0100813 A1 | 4/2012 | Mow et al. |
| 2013/0093447 A1 | 4/2013 | Nickel et al. |
| 2014/0225787 A1 | 8/2014 | Ramachandran et al. |
| 2015/0177277 A1 | 6/2015 | Nickel et al. |
| 2015/0369851 A1 | 12/2015 | Even et al. |
| 2018/0102591 A1 | 4/2018 | Rowell et al. |
| 2018/0364279 A1* | 12/2018 | Del Barga ........... G01R 1/0466 |
| 2019/0007002 A1 | 1/2019 | Wallis |
| 2019/0212386 A1 | 7/2019 | Rowell et al. |
| 2019/0310314 A1 | 10/2019 | Liu et al. |
| 2020/0021369 A1 | 1/2020 | Huynh et al. |
| 2020/0091608 A1 | 3/2020 | Alpman et al. |
| 2020/0313725 A1 | 10/2020 | Abdulai |

OTHER PUBLICATIONS

International Search Report and Written Opinion, International Patent Application No. PCT/US2021/022137, dated Aug. 9, 2021 (12 pages).

* cited by examiner

OVER THE AIR (OTA) CHIP TESTING SYSTEM

FIELD

The present disclosure is directed to test equipment for testing semiconductor devices and/or integrated circuits.

BACKGROUND

As semiconductor devices and integrated circuits (ICs) continually evolve to be smaller and more complex, the test equipment that tests the semiconductor devices and integrated circuits also evolves. There is an ongoing effort to improve the test equipment for semiconductor devices and integrated circuits, with improvements leading to an increase in reliability, an increase in throughput, and/or a decrease in expense.

Mounting a defective semiconductor device (e.g., a device including microcircuit) on a circuit board is relatively costly. Installation usually involves soldering the semiconductor device onto the circuit board. Once mounted on a circuit board, removing a semiconductor device is problematic because the very act of melting the solder for a second time ruins the circuit board. Thus, if the semiconductor device is defective, the circuit board itself is probably ruined as well, meaning that the entire value added to the circuit board at that point is lost. For all these reasons, a semiconductor device is usually tested before installation on a circuit board.

Each semiconductor device must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Test equipment (for semiconductor devices and integrated circuits) itself is complex. First of all, the test equipment must make accurate and low resistance temporary and non-destructive electrical contact with each of the closely spaced contacts in the semiconductor devices and integrated circuits. Because of the small size of contacts in the semiconductor devices and integrated circuits and the spacing between them, even small errors in making the contact will result in incorrect connections. Connections to the semiconductor devices and integrated circuits that are misaligned or otherwise incorrect will cause the test equipment to identify the device under test (DUT) as defective, even though the reason for the failure is the defective electrical connection between the test equipment and the DUT rather than defects in the DUT itself.

A further problem in test equipment for semiconductor devices and integrated circuits arises in circuits which run at high frequencies. Prior art test systems cannot handle these frequencies reliably or without signal losses. Furthermore, shielding of high frequency (HF) ports prevents interference with adjacent ports. With HF ICs testing is especially problematic if the RF ports are located on the bottom side of the IC, i.e. where the pins/pads/balls are located. This is because access to the bottom side is largely occluded by the test housing and load board on which the housing resides. In addition, because some radio frequency (RF) ICs have many different RF emitters, it can be difficult, slow or impossible to provide proper RF coupling to test all of the RF emitters. There simply isn't enough room to provide pickup receivers close enough to the emitters. The disclosure addresses these issues and others.

SUMMARY

The summary below is not intended to define the scope of invention but provide a convenient way for the reader to understand some of the concepts in the entire document. This summary is provided to assist the reader obtaining a quick overview of some key elements of the disclosure.

This disclosure includes a test apparatus for testing device under test (DUT) having an antenna located on the DUT, the test apparatus including any or all of the following elements each to be interpreted as broadly as possible to include any or all of the following elements: a socket configured to electrically connect the DUT to a load board; a gripper assembly configured to hold the DUT in place; a retractor configured to release the DUT from the gripper assembly; and an alignment plate configured to align the DUT with the socket. The gripper assembly includes a base and an extender, the base is attached to the alignment plate or to another component and the extender is configured to hold the DUT in place. When the retractor is disengaged from the extender, the extender is configured to hold the DUT in place. When the retractor is engaged with the extender, the extender is configured to release the DUT on the alignment plate.

This disclosure also includes a test apparatus where the gripper assembly further includes an elastic member, the elastic member is disposed between the base and the extender, and the elastic member is configured to exert a force on the base against the extender.

This disclosure also includes a test apparatus where the elastic member is a spring.

This disclosure also includes a test apparatus where the extender includes a recess, and the recess is configured to fit the DUT into the recess.

This disclosure also includes a test apparatus where the alignment plate includes a horizontal stop, and the horizontal stop is configured to block the movement of the extender toward the DUT.

This disclosure also includes a test apparatus where the alignment plate includes a vertical stop, and the vertical stop is configured to block the movement of the DUT in a direction perpendicular to a top surface of the DUT.

This disclosure also includes a test apparatus further including a tester antenna. The antenna of the DUT is disposed on a top surface of the DUT, and the tester antenna is spaced away from the antenna of the DUT in a direction perpendicular to the top surface of the DUT.

This disclosure also includes a test apparatus further including a tester antenna. The antenna of the DUT is disposed on a side surface of the DUT, and the tester antenna is spaced away from the antenna of the DUT in a direction parallel to the top surface of the DUT.

This disclosure also includes a test apparatus where the retractor is a pin having a tapered end, and the extender includes an opening configured to engage with the pin.

This disclosure also includes a test apparatus where the alignment plate includes an opening with a lead-in chamfer, and the opening of the alignment plate is configured to at least partially house the DUT.

This disclosure also includes a system for testing device under test (DUT) having an antenna located on the DUT, the system including any or all of the following elements each to be interpreted as broadly as possible to include any or all of the following elements: a handler; a tester; and a test apparatus. The test apparatus any or all of the following elements each to be interpreted as broadly as possible: a socket configured to electrically connect the DUT to a load board; a gripper assembly configured to hold the DUT in place; a retractor configured to release the DUT from the gripper assembly; and an alignment plate configured to align the DUT with the socket. The gripper assembly includes a base and an extender, the base is attached to the alignment plate, and the extender is configured to hold the DUT in place. When the retractor is disengaged from the extender, the extender is configured to hold the DUT in place. When the retractor is engaged with the extender, the extender is configured to release the DUT on the alignment plate. The handler is configured to place the DUT on the alignment plate, the tester is electrically connected to the load board, and the tester is configured to test the input and output of the DUT passing through the socket and the load board.

This disclosure also includes a system where the gripper assembly further includes an elastic member, the elastic member is disposed between the base and the extender, and the elastic member is configured to exert a force on the base against the extender. In an embodiment, the elastic member can be optional and/or can be replaced with a pneumatic system or other mechanical mechanism for moving the grippers into position. An automated movement system for the grippers can be used to allow the retractors to be optional and not be needed for proper function of the system.

This disclosure also includes a system where the elastic member is a spring.

This disclosure also includes a system where the extender includes a recess, the recess is configured to fit the DUT into the recess.

This disclosure also includes a system where the alignment plate includes a horizontal stop, and the horizontal stop is configured to block the movement of the extender toward the DUT.

This disclosure also includes a system where the alignment plate includes a vertical stop, and the vertical stop is configured block the movement of the DUT in a direction perpendicular to a top surface of the DUT.

This disclosure also includes a system further including a tester antenna. The antenna of the DUT is disposed on a top surface of the DUT, and the tester antenna is spaced away from the antenna of the DUT in a direction perpendicular to the top surface of the DUT.

This disclosure also includes a system further including a tester antenna. The antenna of the DUT is disposed on a side surface of the DUT, and the tester antenna is spaced away from the antenna of the DUT in a direction parallel to the top surface of the DUT.

This disclosure also includes a system where the retractor is a pin having a tapered end, and the extender includes an opening configured to engage with the pin.

This disclosure also includes a system where the alignment plate includes an opening with a lead-in chamfer, and the opening of the alignment plate is configured to at least partially house the DUT.

Other features are disclosed herein.

BRIEF DESCRIPTION OF THE DRAWINGS

References are made to the accompanying drawings that form a part of this disclosure and which illustrate embodiments in which the systems and methods described in this specification can be practiced.

Like reference numbers represent like parts throughout.

DETAILED DESCRIPTION

This disclosure relates generally to test equipment for testing semiconductor device(s) and/or integrated circuit(s). More specifically, the disclosure relates to systems and methods of test equipment for over the air (OTA) testing of semiconductor device(s) and/or integrated circuit(s).

Embodiments disclosed herein are designed for testing Integrated Circuit (IC) devices. The IC device (and/or a microcircuit) under testing is referred to as Device under Test (DUT). The DUT has antenna(s) on the top surface or side surface(s) of the package of the DUT.

Broadly speaking, a DUT typically has 4 corners. Two corners or more are needed to stabilize the DUT against movement in this configuration. One solution is a movable/retractable corner is resiliently driven into one corner of the DUT into a corner of alignment contactor (150) where a stationary/fixed corner together with the movable corner fix the position of the DUT during test. More than one corner may be movable and/or resilient. Mechanical retraction allows for release of the DUT after test.

Figure 1:
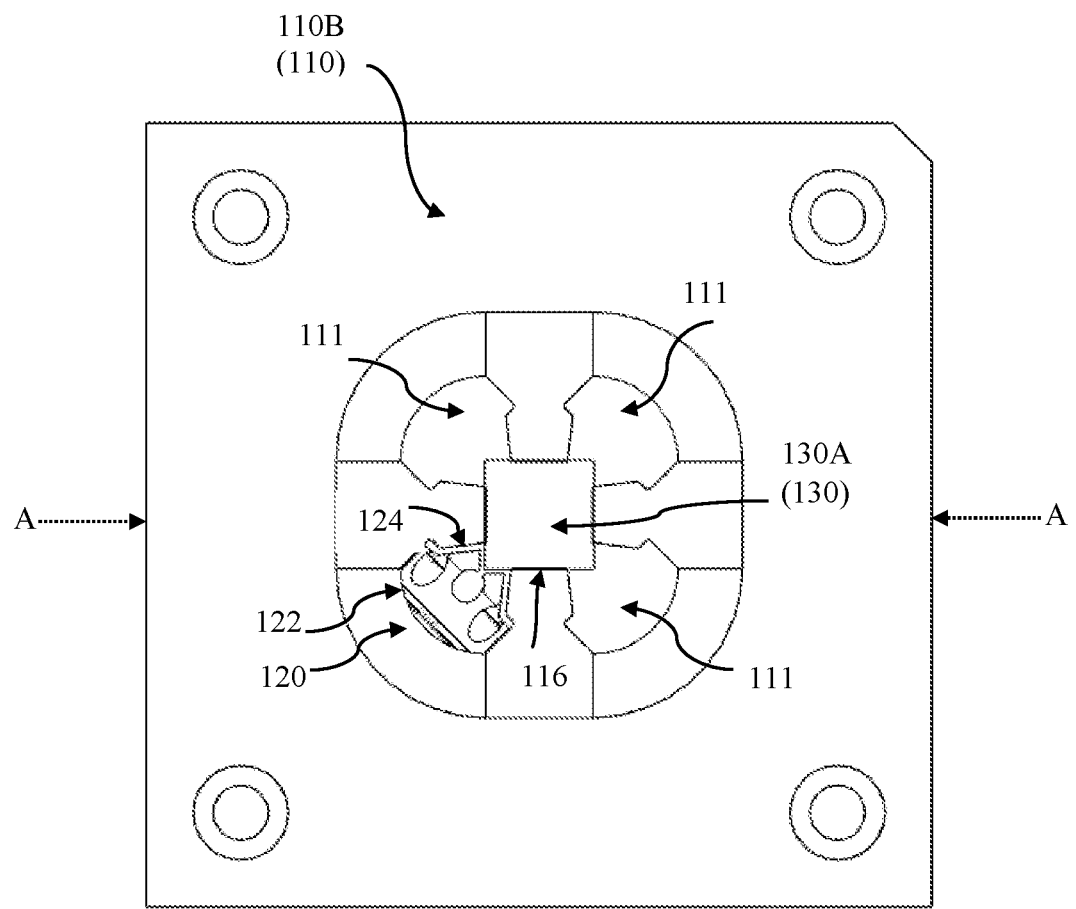
FIG. 1 illustrates a bottom view of an alignment plate (with one gripper assembly) housing a DUT, according to one embodiment. It will be appreciated that all orientation descriptors are merely an example of one possible embodiment to implement the invention. The alignment plate with gripper assembly can be oriented in various different ways and still function properly.
Figure 2:
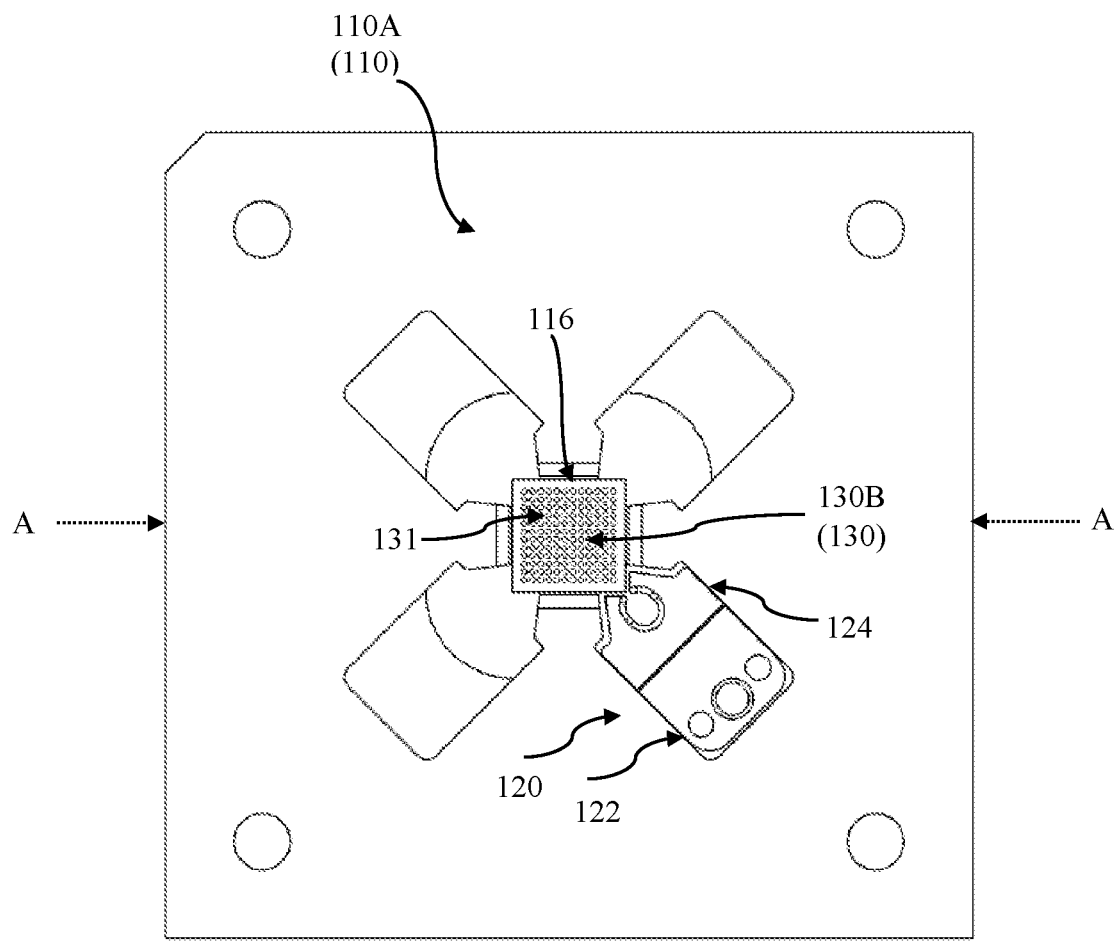
FIG. 2 illustrates a top view of an alignment plate (with one gripper assembly) housing a DUT, according to one embodiment.
Figure 3:
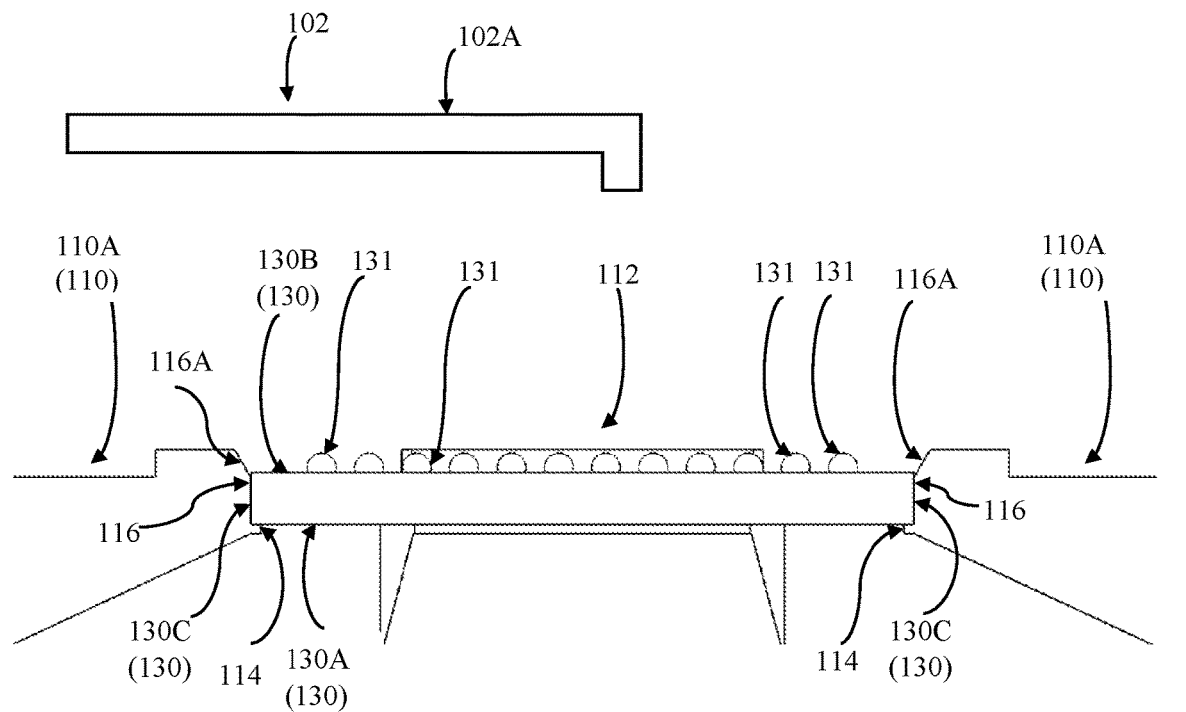
FIG. 3 illustrates a cross-sectional view of the alignment plate housing the DUT of FIG. 1 or FIG. 2 along the line A-A, being in a testing system for testing the DUT, according to one embodiment.
Figure 3:
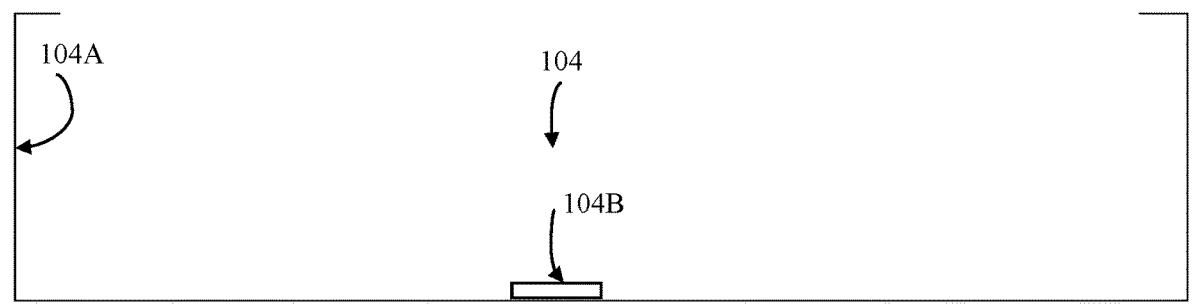
Figure 3:
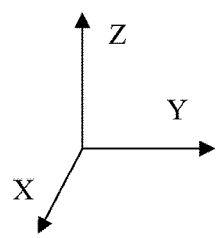

FIG. 1 illustrates a bottom view 110B of an alignment plate 110 (with one gripper assembly 120) housing a DUT 130, according to one embodiment. FIG. 2 illustrates a top view 110A of the alignment plate 110 (with one gripper assembly 120) housing the DUT 130, according to one embodiment. FIG. 3 illustrates a cross-sectional view of the alignment plate 110 housing the DUT 130 of FIG. 1 or FIG. 2 along the line A-A, being in a testing system for testing the DUT, according to one embodiment.

Figure 12:
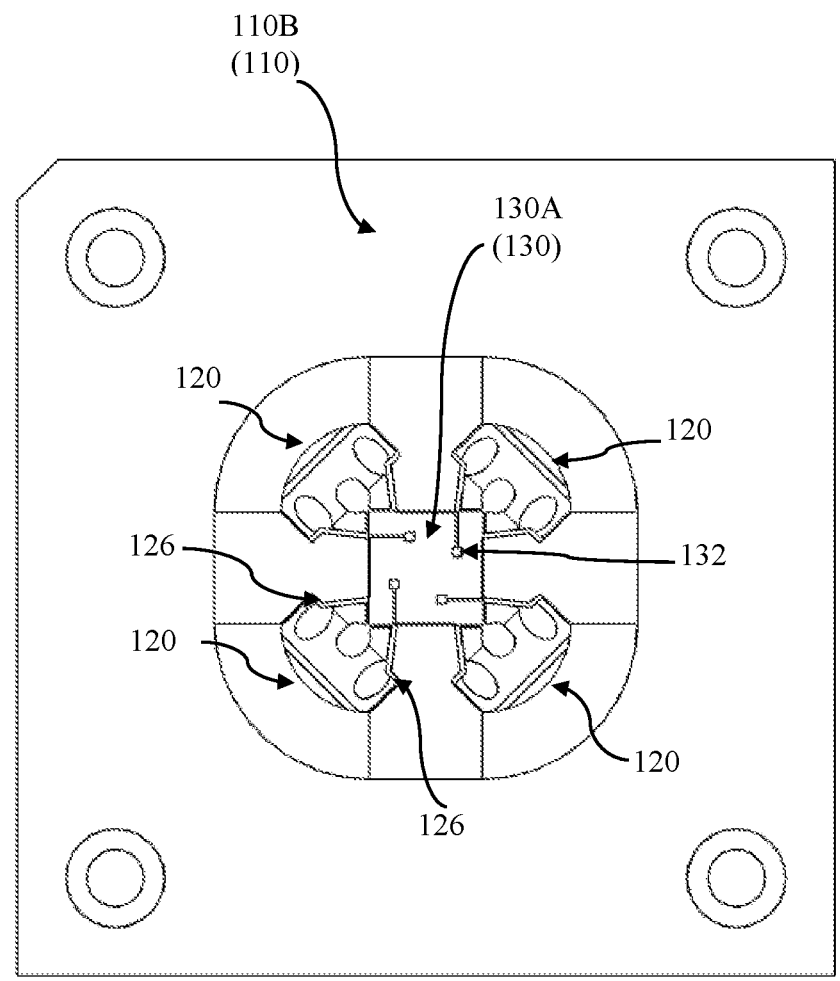
FIGS. 12-44B show various embodiments of the various building blocks of the testing system, according to some embodiments.

The DUT 130 includes antenna(s) (see 132 of FIG. 12). An antenna can be a transmitter and/or receiver that needs to be tested before the DUT 130 being put on the circuit board. It would be very expensive if the DUT 130 is installed on/integrated to a circuit board and the circuit board does not work because of the mal-functioned DUT 130. The antenna of the DUT 130 can be e.g., a radar transmitter/receiver that transmits and/or receives radio frequencies. Radio frequency (RF) is the oscillation rate of an alternating electric current or voltage or of a magnetic, electric or electromagnetic field or mechanical system in the frequency range from around 20 kHz to around 300 GHz. This range is roughly between the upper limit of audio frequencies and the lower limit of infrared frequencies; and within this range, the frequencies at which energy from an oscillating current can radiate off a conductor into space as radio waves.

The antenna(s) of the DUT 130 can be on the top surface/side 130A of the DUT 130, on the peripheral surface(s)/side(s) 130C of the DUT 130, and/or on the bottom surface/side 130B of the DUT. It will be appreciated that typically antenna(s) on the bottom side 130B of the DUT 130 and on the top side 130A of the DUT need different testing methods.

The testing system is for automated Over the Air (OTA) testing of Antenna in Package (AiP) devices. The testing can be conducted automatically and/or manually. In an automatic testing, the testing system includes an automated handling equipment (ATE or handler 102). The handler 102 can pick up the DUT 130 from a container and place the DUT 130 into the testing system (e.g., in and out of the alignment plate).

FIGS. 1-3 show that the DUT 130 is placed/inserted into an alignment plate 110 that holds the DUT 130 into place. The alignment plate 110 and the DUT 130 are disposed above an RF test chamber 104 with antenna testing instrumentation 104B inside. The DUT 110 has a top surface 130A, a bottom surface 130B, and peripheral surfaces 130C (e.g., four peripheral/side surfaces). The top surface 130A is in parallel with the bottom surface 130B. In one embodiment, the pins/pads/balls/contacts/leads 131 ("terminals") of the DUT 130 are located on the bottom surface 130B. In another embodiments, the terminals 131 are located on the side surface(s) 130C of the DUT 130. The terminals 131 include the input/output (TO) of the DUT 130 such as control, data, etc. The arm and axis of the handler can place/inserted the DUT 130 onto/into the alignment plate 110.

The DUT 130 can be in a "dead-bug" (DUT contacts/pins up) configuration (bottom surface 130B where the terminals 131 are located) facing the handler and top surface 130A facing the chamber 104). The chamber 104 is enclosed by an enclosure 104A. The enclosure 104A can be made of, e.g., a radio absorptive material to prevent RF signal reflection on the walls of the enclosure 104A and any multi-pathing that could corrupt the antenna measurement. The radio absorptive material has good attenuating characteristics (to attenuate RF signals) at frequency of test and/or frequency of AiP. The DUT 130 can also be in a live-bug configuration (bottom surface 130B (where the terminals 131 are located) facing the chamber 104 and top surface 130A facing the handler 102).

The alignment plate 110 can be made of plastic or any suitable material. In one embodiment, the alignment plate 110 is machined from a single piece of plastic. The alignment plate 110 can be used to align the DUT 130 with a socket (contactor, see 150 of FIG. 11). The socket has terminals corresponding to the terminals of the DUT 130 and is used to pass the control/data of IO of the DUT 130 to a load board (see 140 of FIG. 11). The load board can be a printed circuit board (PCB) and is connected to a tester (not shown). The tester is used to send control command(s) to the DUT 130, and receive data from the DUT 130; or send data to DUT 130, and receive feedback from the DUT 130, through the IO 131 of the DUT 130 via the socket, to test the DUT 130. The antenna testing instrumentation (receiver, 104B) inside the chamber 104 of the enclosure 104A can be used to test the antenna(s) of the DUT 130. The receiver can connect to the tester. In one embodiment, the antenna(s) of the DUT 130 can broadcast RF and the receiver can receive the broadcasted RF and send the received RF signals to the tester to test the antenna(s) of the DUT 130. The receiver can also be used as a transmitter of the tester to transmit/broadcast RF signals to the antenna(s) of the DUT 130 and the DUT 130 can either respond with sending the feedback RF signals via the DUT antenna(s) to the receiver/transmitter or sending data/feedback through the IO 131 of the DUT 130 to the tester (via the socket and the load board), so that the tester can test the antenna(s) of the DUT 130.

In another embodiment, the testing system can include a second handler arm (not shown). The second handler arm can be a handler nest that includes the socket, the load board, and/or the alignment plate 110. In one embodiment, the second handler arm can be the same as the (first) handler arm of the testing system. It will be appreciated that embodiments disclosed herein do not limit the handler construction method or number of handler plungers used to perform automated testing.

In a "live-bug" (pins/contacts down) configuration (the top surface 130A of the DUT 130 facing the handler 102 and the bottom surface 130B of the DUT 130 facing the chamber 104), the socket is located underneath the alignment plate 110 and is disposed above the load board. The alignment plate 110 has an opening 112 to house the DUT 130 so that the DUT 130 can be aligned with the socket (to communicate with the tester via the socket and the load board). The socket is to pass IO signals from/to the DUT 130, to/from the tester through the load board via electrical contacts of the terminals of the socket and the terminals 131 of DUT 130. The opening 112 of the alignment plate 110 can help guide the (robotic) arm 102A of the handler 102 to put the DUT 130 in place on the alignment plate 110. In one embodiment, the opening 112 of the alignment 110 is tapered. The socket is disposed underneath the DUT 130. The DUT 130 has antenna(s) that can broadcast RF (e.g., high frequency (HF) signals) and/or receive RF signals. The handler 102 can push the DUT 130 down into the opening 112 of the alignment plate 110 to align with and contact the socket. It will be appreciated that with the live-bug configuration, if the antenna(s) of the DUT 130 are on the top surface 130A of the DUT, the handler 102 can interfere with the RF signals broadcasted from the antenna(s) on the top 130A of the DUT 130. Such configuration works very well if the antenna(s) of the DUT 130 is on the bottom 130B or side surface(s) 130C of the DUT 130.

During the live-bug configuration testing, the handler arm 102 carries the DUT 130 and punches/pushes the DUT 130 in the alignment plate 110 to align with the socket. The socket is stationary under the alignment plate 110, and the load board is under the socket. In one embodiment, when the antenna(s) of the DUT 130 are on the top surface 130A of the DUT 130, material (such as Raydome material) can be used to enable the RF signals to transmit/propagate through the handler 102 so that the handler 102 do not interfere with the RF signals broadcasted from the antenna(s) on the top 130A of the DUT 130.

A dead-bug configuration (the top surface 130A of the DUT 130 facing the chamber 104 and the bottom surface 130B of the DUT 130 facing the handler 102) works well if the antenna(s) of the DUT 130 is on the top surface 130A of the DUT 130. In FIG. 3, the DUT 130 is place on the alignment plate 110, and a handler nest (not shown) can push the socket down onto the bottom surface 130B of the DUT 130 so that the DUT 130 can be tested. In one embodiment, the load board is located above the socket. In another embodiment, the load board can locate anywhere (e.g., on the top of the chamber 104 but below the alignment plate 110 to hold the alignment plate 110) and the socket can route the 10 signals of the DUT 130 to the load board by wiring, connectors, connecting circuit board, etc.

During the dead-bug configuration testing, the handler 102 carries the DUT 130 upside down (dead-bug), and places the DUT 130 into the alignment plate 110 that aligns and holds the DUT 130. In one embodiment, the alignment plate 110 includes a gripper assembly 120. In one embodiment, the gripper assembly 120 can be a component separate from the alignment plate 110. The gripper assembly 120 may include a base 122 and an extender 124, or the gripper assembly 120 can be made from a single part if preferred (see e.g., FIG. 11). That is, the base 122 and the extender 124 of the gripper assembly 120 can be integrated as a single part.

FIG. 3 shows a chamber 104 having antenna testing equipment designed to receive the RF signals being broadcasted by/from the antenna(s) on the DUT 130. The handler nest then comes down and brings/pushes the socket down on top of the DUT 130 for testing. The alignment plate 110 and the gripper assembly 120 are designed to provide clearance 112 both for the socket and for the antenna(s) on the DUT 130. After testing of the DUT 130 is completed, the handler nest moves the socket back up away from the DUT 130. The alignment plate 110 and the gripper assembly 120 hold the DUT 130 in position when the socket is moved away. Then the handler 102 removes the DUT 130 from the alignment plate 110 and the gripper assembly 120.

In the dead-bug configuration, the RF signal broadcasted by the DUT 130 can be outside of the handler 102 (e.g., the RF signals are broadcasted in a direction towards the chamber 104), and such configuration does not have to use the Raydome (radar dome) material. It will be appreciated that under such configuration, in one embodiment, the broadcasted RF signals can have clear path through the chamber 104 since there is nothing (no other components) between the antenna(s) of the DUT 130 and the receiver antenna in the chamber 104.

In an embodiment, the handler nest can include the socket, the load board, wiring harness to carry/route the 10 signals from the DUT 130 (via the socket to the load board) to the tester (testing equipment).

Back to FIGS. 2 and 3, FIG. 2 illustrates a top view of an alignment plate 110 (with one gripper assembly 120) housing the DUT 130 (the bottom surface 130B of the DUT having terminals 131 is shown), according to one embodiment. The DUT 130 is in a dead-bug configuration (the bottom surface 130B of the DUT faces the handler 102 and contacts the socket during the testing). The gripper assembly 120 includes a base 122 and an extender 124 (will describe in detail in following sections). The alignment plate 110 includes an aligner 116 and a vertical stop 114 at each side of the DUT.

It will be appreciated that the alignment plate 110 can include 1, 2, 3, or 4 gripper assemblies 120. In general, the objective of the gripper 120 is to hold the DUT 130 into a fixed position for during DUT 130 test and the release it after test. Because of the nature and layout of certain DUTs 130, it is not possible to apply downward pressure on the DUT 130 during test, such as because of antennas on the top surface 130A, so other structures are needed to accomplish this. In particular, it is desirable to grip the DUT 130 on its outer peripheral edges 130C and especially with rectangular DUTs 130, at or near its corners so as to not interfere with leads, etc.

In an embodiment, the grippers or the alignment plate may have clearance features (not shown) that allow the handler plunger to hold the DUT by its edges or corners during insertion and removal. It will be appreciated that certain types of DUTs may be difficult to automatically handle in a dead bug position without the ability to hold the DUT by its edges.

In one embodiment, as shown in FIGS. 2 and 3, the DUT terminals 131 are located at the bottom surface 130B of the DUT 130. The extender 124 of the gripper assembly 120 engages with the corner of the DUT 130 where two sidewalls 130C converge. It will be appreciated that the extender 124 of the gripper assembly 120 can engage with the side 130C instead of the corner of the DUT 130. It is possible to use a retractable gripper 120 at 1, 2, 3, 4 or all corners or only one corner of the DUT 130 with fixed engagement points at other corners or sidewalls. It may be sufficient to engage and grip the DUT on two or three sides rather than all four if that is necessary in order to provide clearance for antenna(s) or other device features.

Back to FIGS. 1 and 3, FIGS. 1 and 3 illustrates a bottom view of and a cross-sectional view of an alignment plate 110 (with one gripper assembly 120) housing the DUT 110, according to one embodiment. The DUT 130 is in a dead-bug configuration (the top surface 130A of the DUT 130 faces the chamber 104). The extender 124 of the gripper assembly 120 is shown. It will be appreciated that the alignment plate 110 can include 1, 2, 3, or 4 gripper assemblies 120.

In one embodiment, antenna(s) can be on the top surface 130A of the DUT 130. In another embodiment, the antenna(s) can be on the side surface(s) 130C of the DUT 130. In such embodiment, the receiver antenna can be on the alignment plate 110, the sides of the chamber 104A or on the handler 102. On the alignment plate 110, the places (near the other three corners of the DUT 130) can be designed as openings 111 (which can be place holder for other gripper assemblies 120).

In FIG. 3, the frame of the alignment plate 110 includes an aligner 116 (total 4) and a vertical stop 114 (total 4) at each side 130C of the DUT 130. The aligner 116 has a lead-in chamfer 116A. The vertical stop 114 (z-stop, referring to the movement in z direction instead of in x, y directions) is to stop/support the DUT 130 in the vertical direction so that the DUT 130 can be housed in the opening 112 of the alignment plate 110 and supported by the vertical stop 114. The vertical stop 114 can be configured to prevent the DUT 130 from moving away from the socket. In one embodiment, the vertical stop 114 can be optional. The vertical stop 114 can be incorporated into both the alignment plate and the grippers, grippers only, alignment plate only, or neither. A ball grid array (BGA) DUT 130 is shown, however, it will be appreciated that the DUT 130 can have other types of terminals 131 such as Pad, land grid array (LGA), Leaded, etc. It will also be appreciated that alignment plate 110 can be used for live-bug configuration.

The height/thickness of the aligner 116 and/or the vertical stop 114 can adjust the vertical position of the DUT 130 so that the DUT 130 can be in contact with the socket and get right (predetermined) compression/pressure on the socket. This is important since if the contact between the DUT 130 and the socket is bad or not stable, the testing would fail (e.g., the testing can test open circuit for connectivity; the tester can determine whether there is an open circuit before formal testing is started).

It will be appreciated that the aligner 116 and the vertical stop 114 can be on the side 130C or on the corner of the DUT 130, and the gripper assembly 120 can be correspondingly on the corner or the side 130C of the DUT 130.

Figure 4:
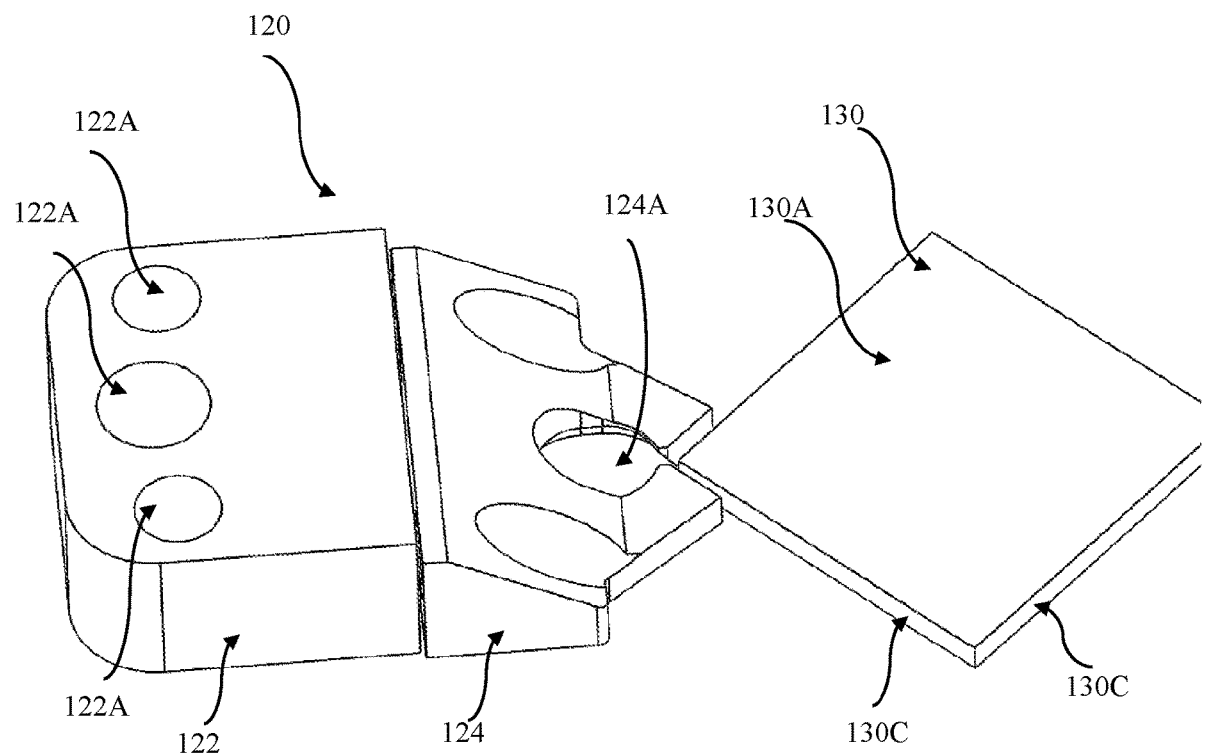
FIGS. 4-6 are perspective views of a gripper assembly, according to some embodiments.
Figure 5:
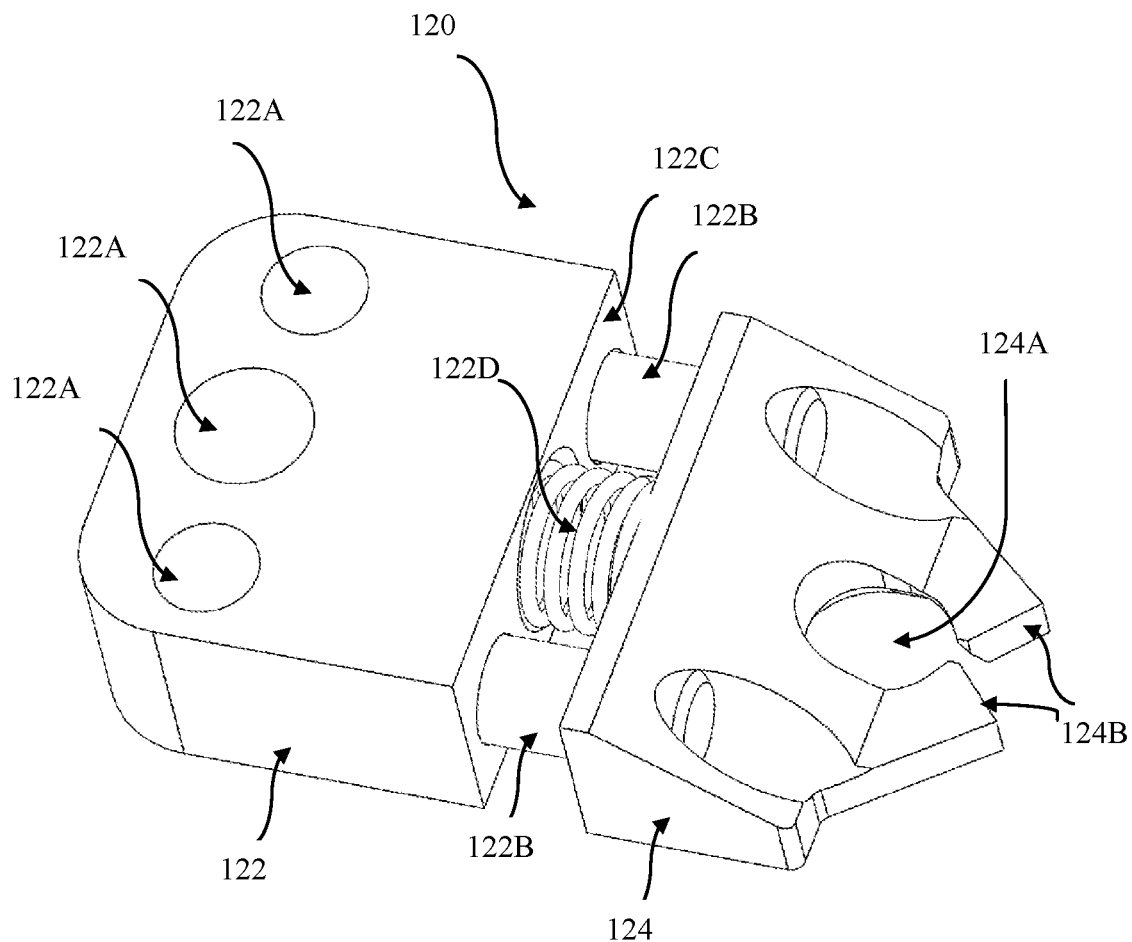
Figure 6:
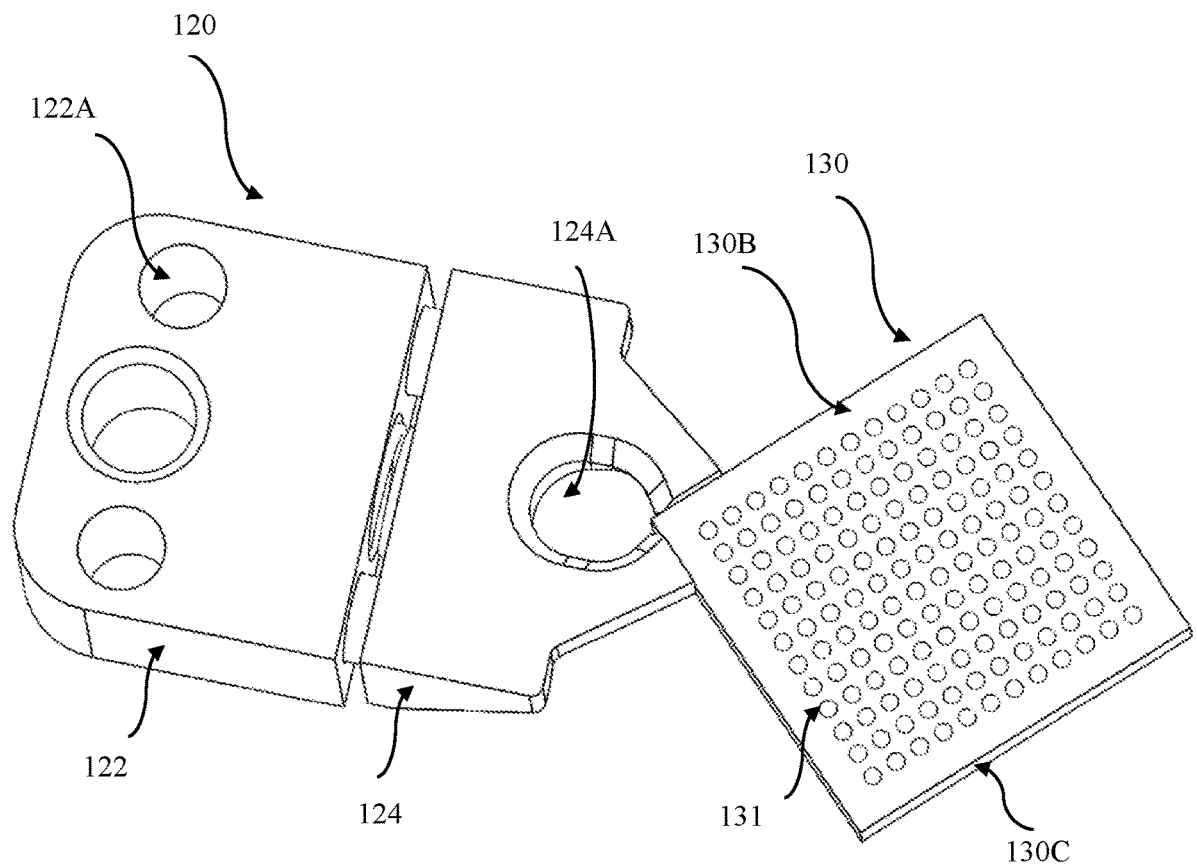

FIGS. 4-6 are perspective views of a gripper assembly 120 (engaging with a corner of a DUT 130), according to some embodiments. The gripper assembly 120 includes a base 122 and an extender 124. The base 122 can be fixed to the frame of the alignment plate 110 or the enclosure of the testing system. In one embodiment, the base 122 includes three openings 122A for bolts and pins to fasten and locate the base 122 to the alignment plate 110 or the enclosure or by any other means to make the base 122 fixed relative to the DUT 130 and alignment plate. The extender 124 is configured be elastomerically coupled to the base 122. It can include two longitudinal openings (124C of FIGS. 9 and 10). The longitudinal openings can be used to receive dowel pins 122B extending from a side 122C of the base 122 (see FIG. 5). The dowel pins 122B can be configured to prevent the extender 124 from rotating in response to turning torque forces and thus maintain in alignment when the extender 124 engages a portion or corner of the DUT 130. An elastic member 122D is disposed between the base 122 and the extender 124. The elastic member 122D is configured to exert a force on the base 122 against the extender 124 when pressed. In one embodiment, the elastic member 122D is a spring. It will be appreciate that the force of the spring 122D can be either relatively strong (e.g., if the alignment plate 110 does not have the vertical stop 114 to support/stop the DUT 130) or weak (e.g., if the alignment plate 110 has the vertical stop 114 to support/stop the DUT 130). The extender 124 can also include a structure for retracting same to allow insertion of the DUT 130. In an embodiment a vertical opening 124A is provided and sized to receive a retractor pin (see 106 of FIGS. 7 and 8). The vertical opening 124A can be engaged with e.g., a retraction pin which may be on the handler 102 or by a separate retractor device which has a properly sized pin. The vertical opening 124A can be a chamfered hole (see FIG. 6) to ensure easy entry of the retractor pin even if it is not exactly aligned. This gripper assembly shows one potential embodiment. The gripper can be a single piece mounted directly to the alignment plate or the housing with a compliant member between them.

FIG. 4 shows a gripper assembly 120 engaging with a corner of a DUT 130. It will be appreciated that the gripper assembly 120 can be designed to engage with a side 130C of the DUT 130 instead of the corner. It will also be appreciated that there can be 1, 2, 3, or 4 gripper assemblies 120 in the testing system. The gripper assembly 120 may have a part of wedge shaped prongs 124B (see FIG. 5), which together form a corner to engage the DUT 130. The DUT 130 is held in place by 1, 2 or 3, other fixed/movable base elements (e.g., 116 of FIG. 3) which can engage the remaining corners or sidewalls of the DUT 130. FIGS. 4 and 5 show the views from the DUT 130 antenna (on the top surface 130A of the DUT 130) side.

FIG. 6 show the view from the socket side (the socket contacting the bottom 130B of the DUT 130 during the testing).

Figure 7:
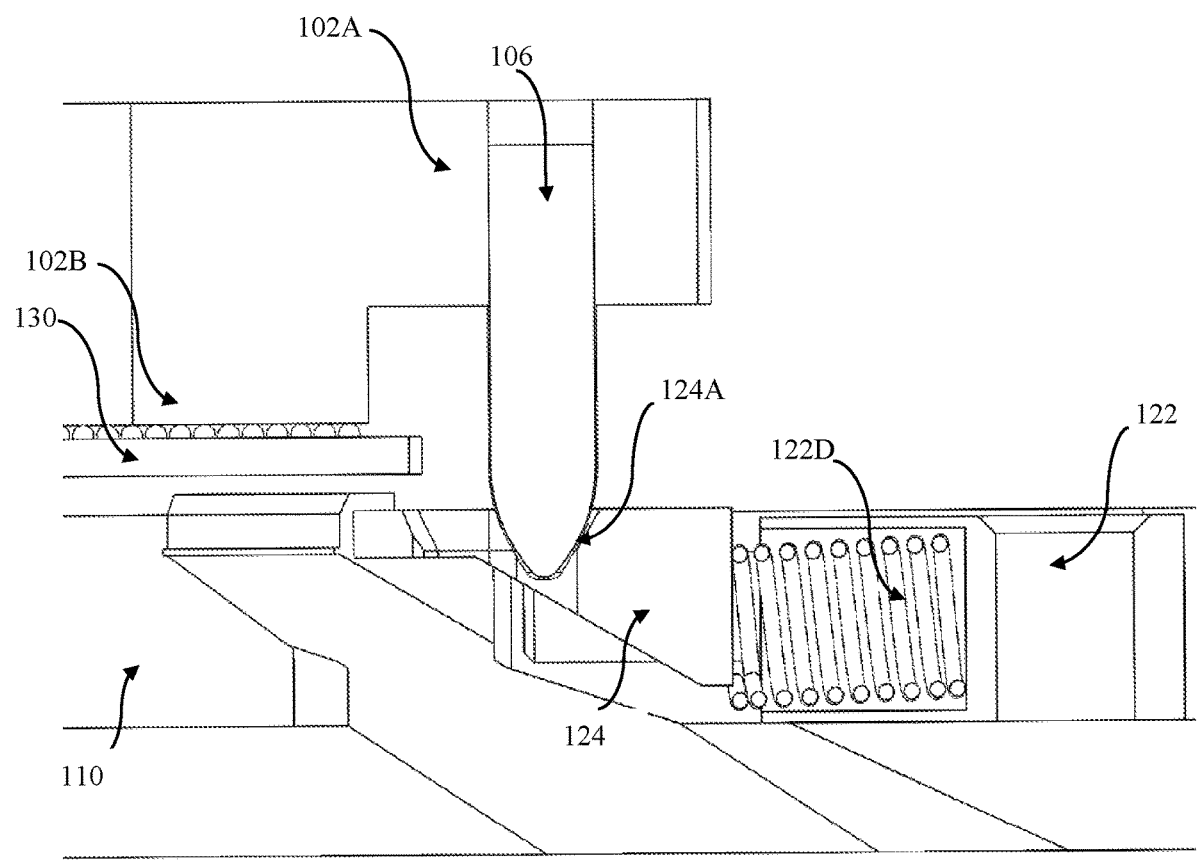
FIG. 7 illustrates a cross-sectional view of a retraction pin of handler (of a testing system) engaging with an alignment plate with a gripper assembly, according to one embodiment.

FIG. 7 illustrates a cross-sectional view of a retraction pin 106 of a handler 102 (of a testing system) engaging with an alignment plate 110 with a gripper assembly 120, according to one embodiment. The handler 102 includes a retraction pin 106. The retraction pin 106 can be a tapered pin. The retraction pin 106 can be inserted (doweling) into the vertical opening 124A (the chamfered hole of the extender 124 of the gripper assembly 120) to engage the extender 124 and to guide the extender 124 (to push the extender 124 away from the DUT 130).

Figure 8:
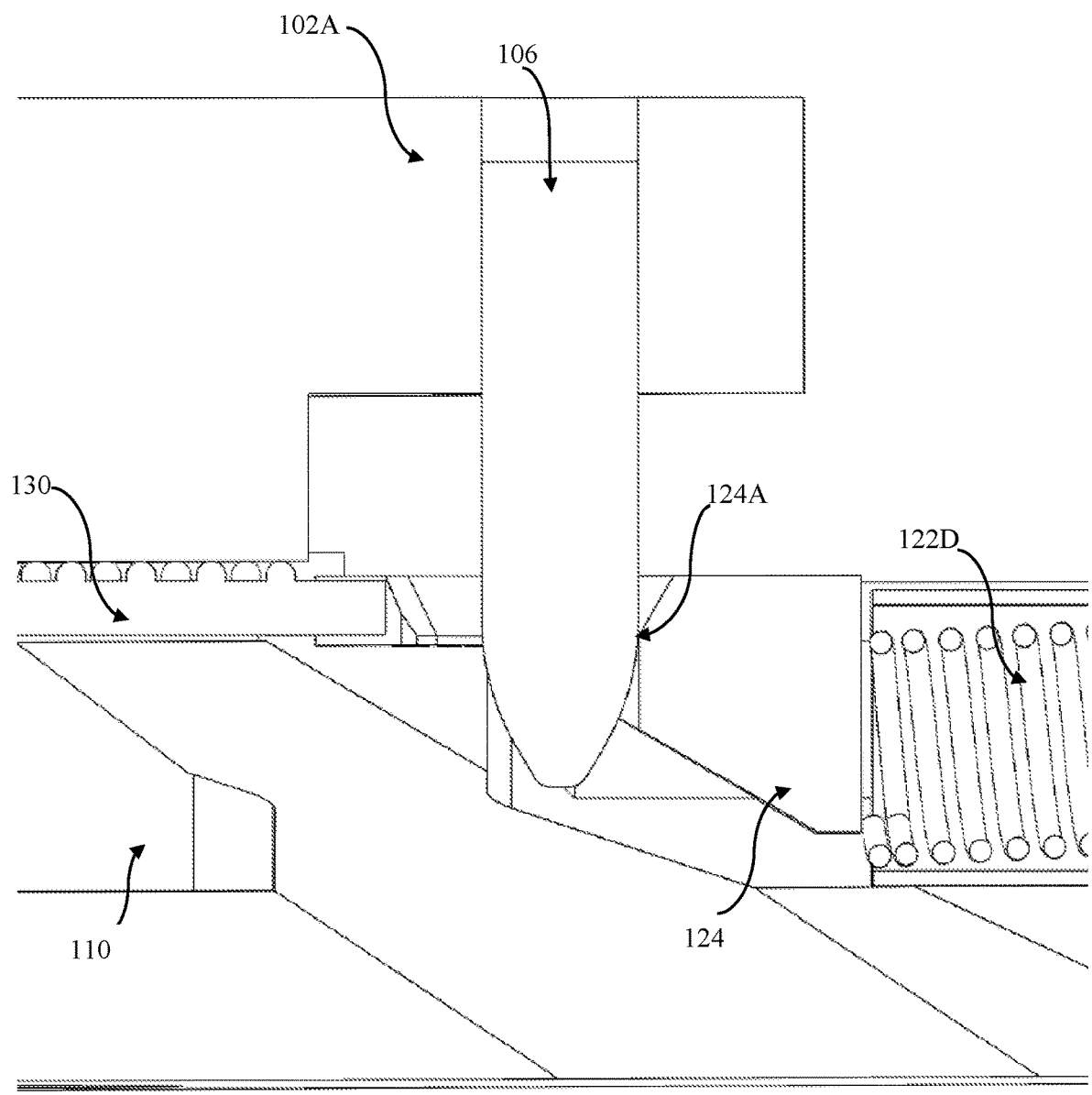
FIG. 8 illustrates a cross-sectional view of a retraction pin of a handler (of a testing system) fully engaged with an alignment plate with a gripper assembly, according to one embodiment.

FIG. 8 illustrates a cross-sectional view of a retraction pin 106 of a handler 102 (of a testing system) fully engaged with an alignment plate 110 with a gripper assembly 120, according to one embodiment. The retraction pin 106 of the handler 102 is fully engaged (e.g., press fit) with the vertical opening 124A of the extender 124. The gripper assembly 120 is retracted away from the DUT 130 as the extender 124 is fully engaged with the retraction pin 106. In one embodiment, the handler nest (or the handler 102) and the retraction pin 106 form one handler assembly. When the extender 124 is fully engaged with the retraction pin 106, the handler 102 can drop the DUT 130 in the opening 112 of the alignment plate 110 that houses the DUT 130, or pick up the DUT 130 from the alignment plate 110.

The retraction pin 106 of the handler 102 (or handler nest) interacts/engage with the vertical opening 124A of the extender 124 of the gripper assembly 120. As there can be 1, 2, 3, or 4 gripper assemblies 120 in the testing system, there can be 1, 2, 3, or 4 retraction pins 106 as well. As the handler 102 approaches the gripper assembly 120, the retraction pin(s) 106 push the extender 124 away from the DUT 130 in a horizontal direction (e.g., Y direction). The retraction pin(s) 106 also aid in aligning the handler 102 to the gripper assembly 120. The handler 102 moves toward the gripper assembly 120 until the DUT 130 is placed on the vertical stop(s) 114 of the alignment plate 110. Then the handler 102 releases the DUT 130 so that the DUT 130 is put in place on the alignment plate 110. The aligner 116 and the vertical stop 114 can hold and position the DUT 130 in place. The aligner 116 and the vertical stop 114 can be very small and have a tight fit to the body of the DUT 130, also the aligner 116 and the vertical stop 114 can be sized differently with a larger gap around the DUT 130 and larger vertical stop ledges 114, depending on the requirements of the DUT 130.

When the retraction pin(s) 106 start to engage with the extender(s) 124 and move the extender(s) 124 away from the DUT 130, the DUT 130 is getting closer to the frame of the alignment plate 110. When the retraction pin 106 of the handler 102 is fully down (engaged with the extender 124), the extender 124 is fully retracted (from the DUT 130) by the retraction pin 106. The DUT 130 is fully seated against the vertical stop(s) 114 of the alignment plate 110.

It will be appreciated that the extender 124 can be designed with a ledge that interacts with an edge or protrusion of the handler 102 for retraction rather than using retraction pins 106 (such as dowel pins).

It will also be appreciated that the handler 102 can be designed with a moveable feature to engage and release the extender(s) 124. In such design, the handler 102 can allow the extender 124 to engage the DUT 130 while the handler 102 is still holding the DUT 130 into the frame of the alignment plate 110. Thus the DUT 130 can be prevented from moving when the handler 102 releases the DUT 130 and moves away to make room for the socket to test the DUT 130. Such design does not rely on gravity to hold the DUT 130 against the vertical stop(s) 114 of the alignment plate 110 until the handler 102 is far enough away to disengage the retraction pins 106 and allow the extender(s) 124 to move forward against the DUT 130 edges/corners.

It will further be appreciated that the extender(s) 124 can be designed to pivot or rotate rather than sliding straight in and out from the DUT 130. The advantage of the straight movement design shown in the Figures is that it can be less likely to lift or rotate (misalign) the DUT 130 when the extender(s) 124 engage with the DUT 130.

Figure 9:
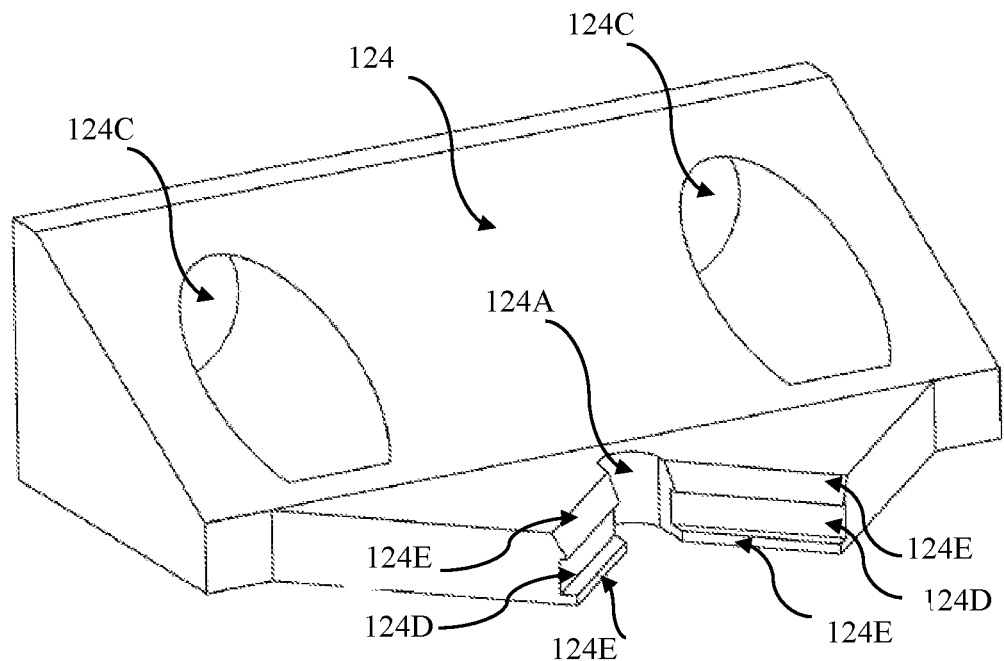
FIGS. 9-10 are perspective views of a gripper assembly, according to some embodiments.
Figure 10:
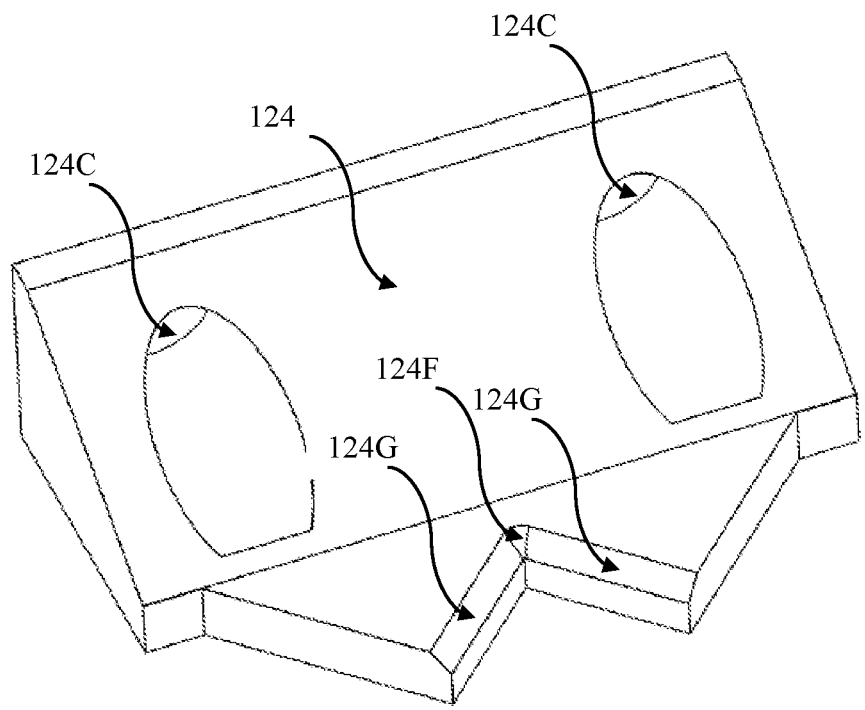

FIGS. 9-10 are perspective views of a gripper assembly 120, according to some embodiments.

It will be appreciated that the gripper assembly 120 can be designed with chamfers 124G on the edges of the gripper assembly 120 that hold the DUT 130 so that the gripper assembly 120 can be pushed to the side by the edges 130C of the DUT 130 when the handler 102 pushes the DUT 130 down into the alignment plate 110 (with the gripper assembly 120). The chamfers 124G on the gripper assembly 120 can take the place of the retraction pins 106 of the handler 102. It will be appreciated that the gripper assembly 120 can wear out more rapidly since when use the DUT 130 to push the gripper assembly 120 (having chamfer 124G) instead of using the retraction pin 106, the gripper assembly 120 might wear out fast over time. Also, the handler 102 has to exert more force to pull the DUT 130 away from the gripper assembly 120 after the testing is complete. FIG. 10 shows the gripper assembly 120 with chamfers 124G. It will be appreciated that the gripper assembly 120 and the frame (of the alignment plate 110) may not protrude above a top surface of the DUT 130. It will be appreciated that the (frame of the) alignment plate 110 can be thicker than (or thinner than or the same thickness as) the thickness of the DUT 130. It will be appreciated that the gripper assembly can be designed to move automatically using pneumatic pressure or other mechanisms that allow the device to be positioned and removed without requiring a retractor assembly to be part of the handler arm. The chamfers or vertical stops on the grippers may become optional in that case.

It will be appreciated that each of the features in the embodiments disclosed herein can be combined with other features in the embodiments disclosed herein, unless specified otherwise. For example, in an alignment plate 110 with multiple gripper assemblies 120, there can be different features for retracting and engaging each of the gripper assembly 120 with the DUT 130. This design can help to prevent failure as the various features can provide backup for each other.

It will be appreciated that the gripper assembly 120 can be fixed on the alignment plate 110. In another embodiment, the gripper assembly 120 can be fixed (e.g., bolted) onto the enclosure/housing of the testing system.

It will also be appreciated that the alignment plate 110 with the gripper assembly 120 can be made of separate pieces (moveable gripper components 120 or moveable fingers) instead of one piece. The advantage of machining the moveable gripper components 120 separately can be cost saving. Also it is possible for the moveable alignment plate components 110 (or the moveable gripper components 120) to accommodate DUTs 130 that have more dimensional variations. Further, moveable alignment plate components 110 (or the moveable gripper components 120) can take longer time to wear out. It will be appreciated that if the alignment plate 110 is made of one piece instead of 4 pieces, the alignment might be more accurate (and need less other features to make sure all 4 pieces are aligned) since more pieces may stack up errors.

FIG. 9 shows a gripper assembly 120 with ledges 124E both above and below the DUT. Such configuration can be used if a tighter hold on the DUT is needed. In such configuration, the gripper assembly 120 has a recess/indention 124D (with ledges 124E both above and below the DUT) to fit the DUT into the recess/indention 124D. The edges of the recess may be straight as shown or may be tapered depending on the requirements of the specific configuration.

FIG. 10 shows a gripper assembly 120 with square inside corner(s) 124F and with no radius. Such design can improve the alignment of small devices.

It will be appreciated that in the live-bug configuration, the socket and the alignment plate 110 with the gripper assembly 120 are stationary, and the DUT 130 is pushed down (e.g., by the handler 102) against them. Then the handler or handler arm 102 moves away, leaving the DUT 130 in position. The DUT 130 is compressed into the socket and the alignment plate 110 with the gripper assembly 120 prevents the DUT 130 from moving. The same or a secondary handler or handler arm 102 brings a single or array of receiver antennas into position (e.g., around the DUT 130 if the antenna(s) of the DUT 130 are located on the side surface(s) 130C of the DUT 130). Then the electrical testing of the DUT 130 is initiated.

It will be appreciated that the alignment plate 110 and/or the gripper assembly 120 can be thicker than, thinner than, or the same thickness as the thickness of the DUT 130.

It will also be appreciated that the alignment plate 110 with the gripper assembly 120 can include receiver antenna(s) to pick up the RF signals broadcasted from the edges 130C of the DUT 130, if the antenna(s) of the DUT 130 are located on the side surface(s) 130C of the DUT 130.

It will further be appreciated that the handler 102 (or handler nest) can be designed with one or multiple receiver antennas to pick up the RF signals broadcasted from the top 130A and/or sides 130C of the DUT 130. Such design would allow testing without the gripper assembly 120 feature, because the handler 102 can stay in position during the test.

Figure 11:
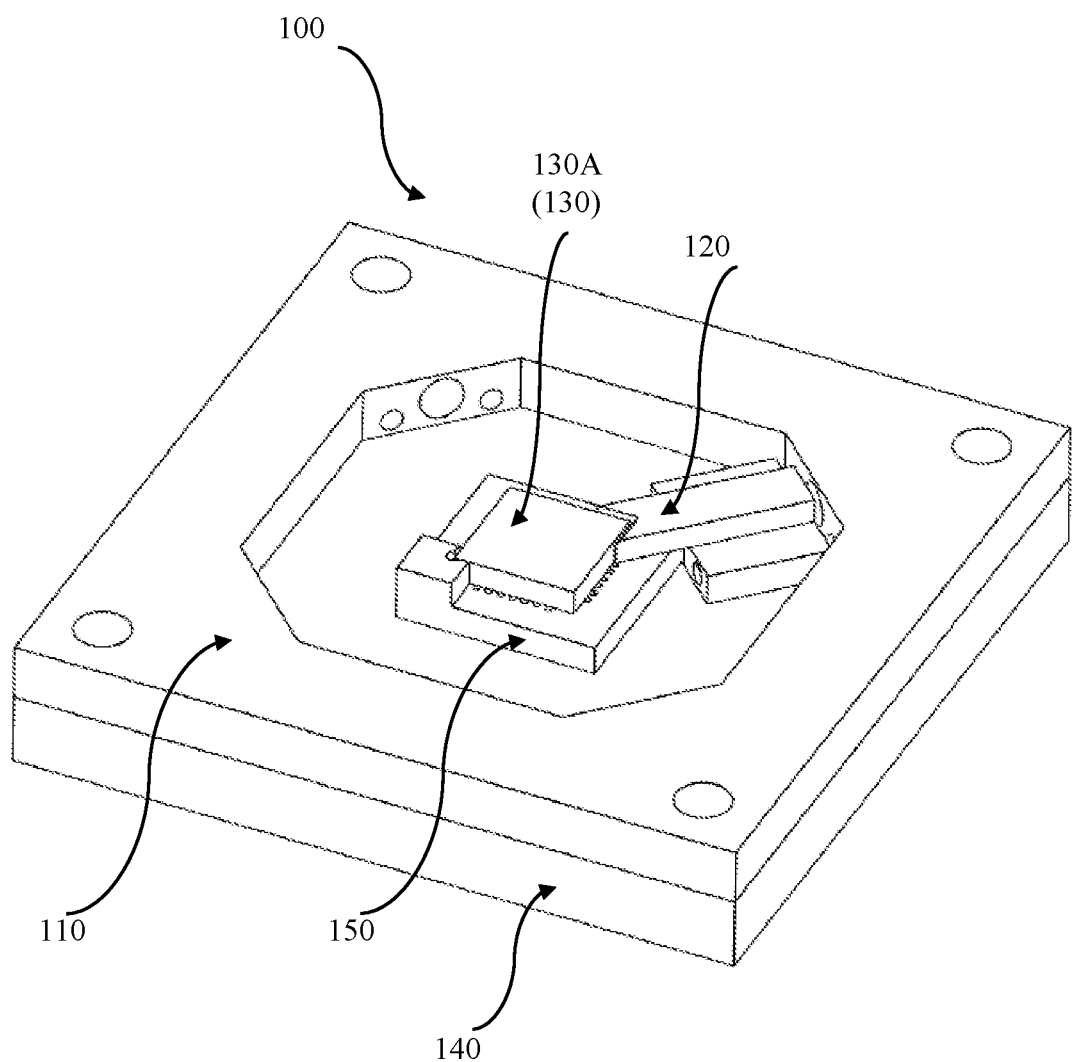
FIG. 11 is a perspective views of a portion of a testing system, according to one embodiment.

FIG. 11 is a perspective views of a portion of a testing system 100, according to one embodiment. It will be appreciated that a main body of the socket 150 can be small with the structure of the alignment plate 110 with the gripper assembly 120 surrounding the socket. The gripper assembly 120 can extend from the alignment plate 110 inward over the socket 150. Such design can minimize the interference between the alignment plate 110/gripper assembly 120 and the RF signals broadcasted from the antennas on the DUT 130.

Figure 13:
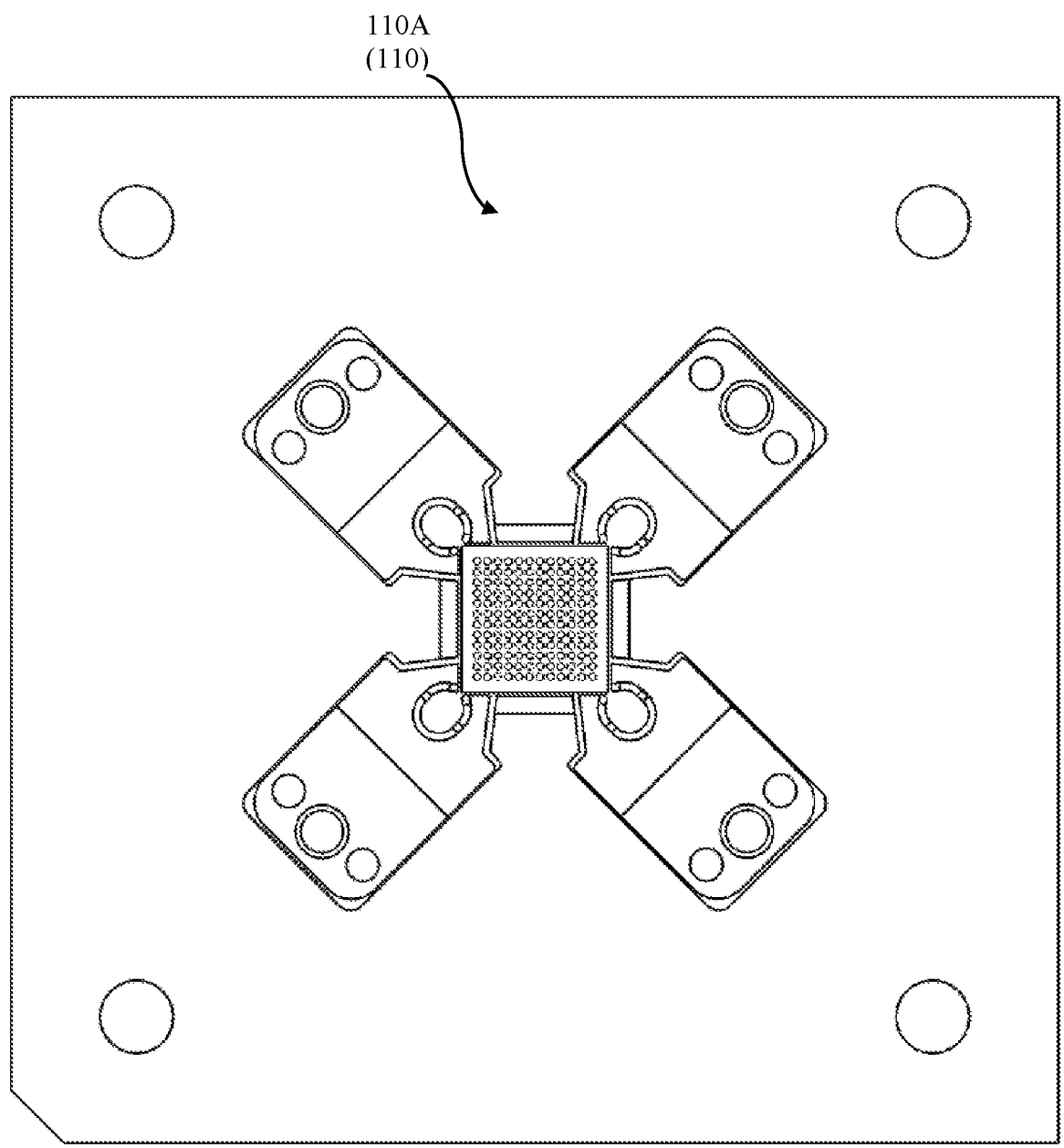
Figure 14:
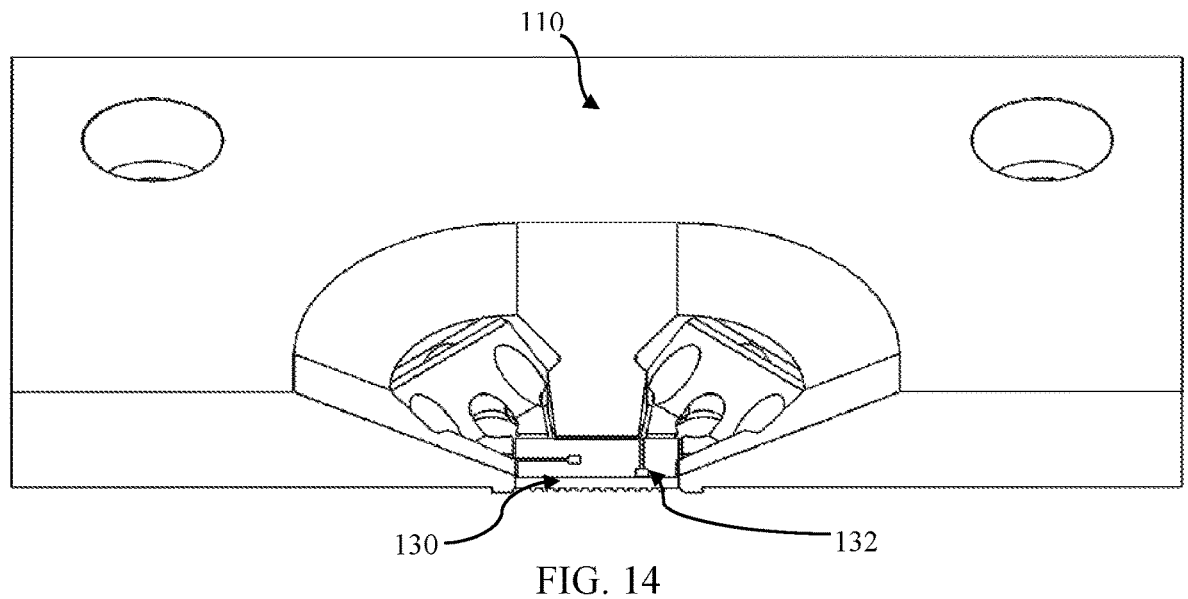
Figure 15:
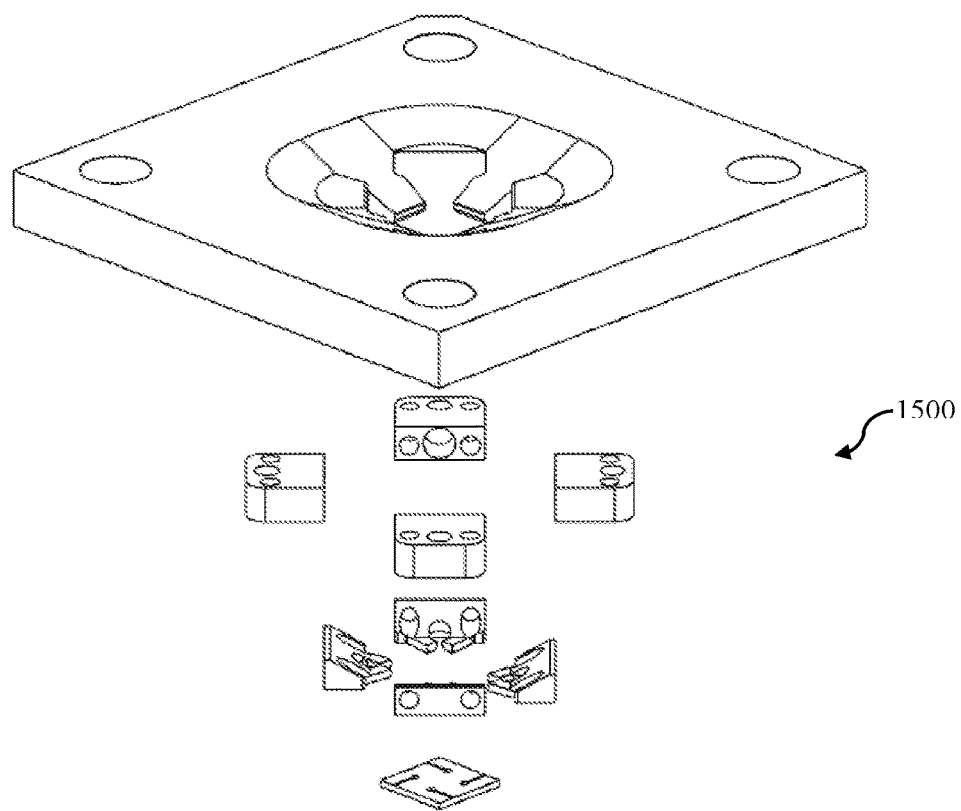
Figure 16:
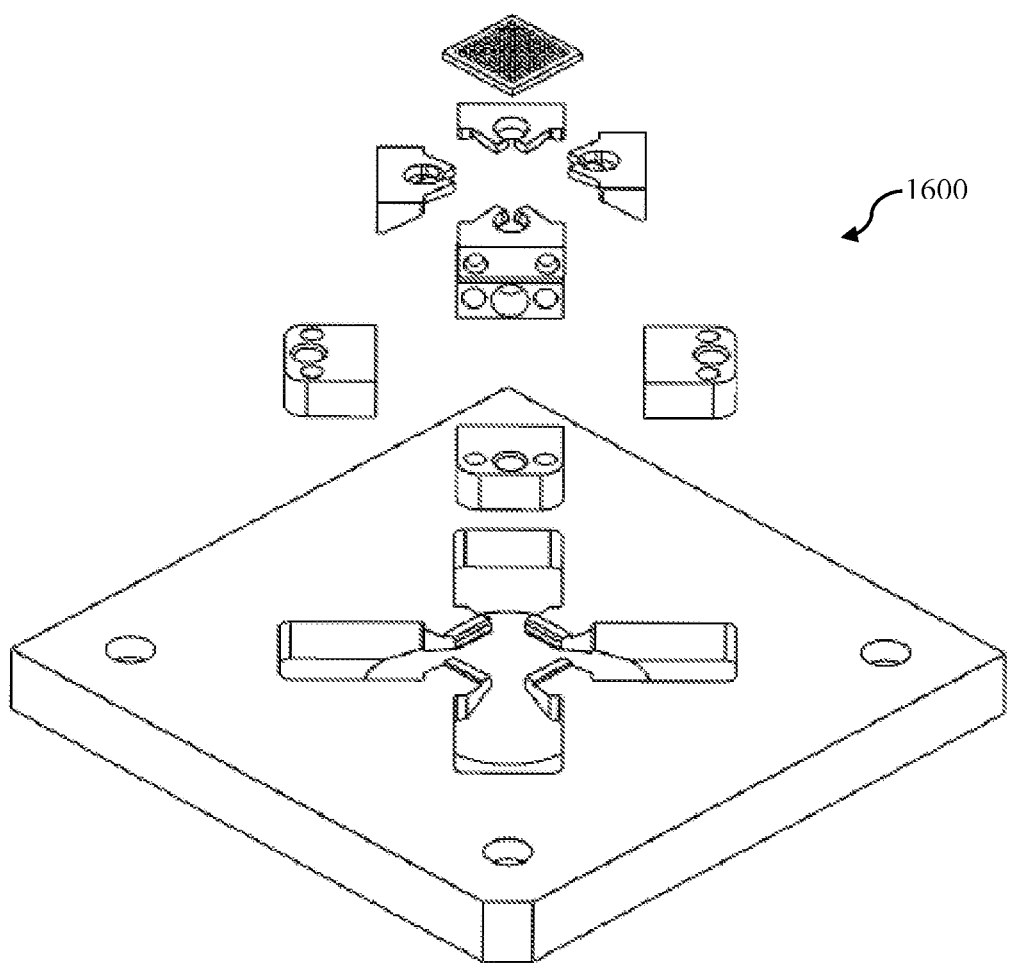
Figure 17:
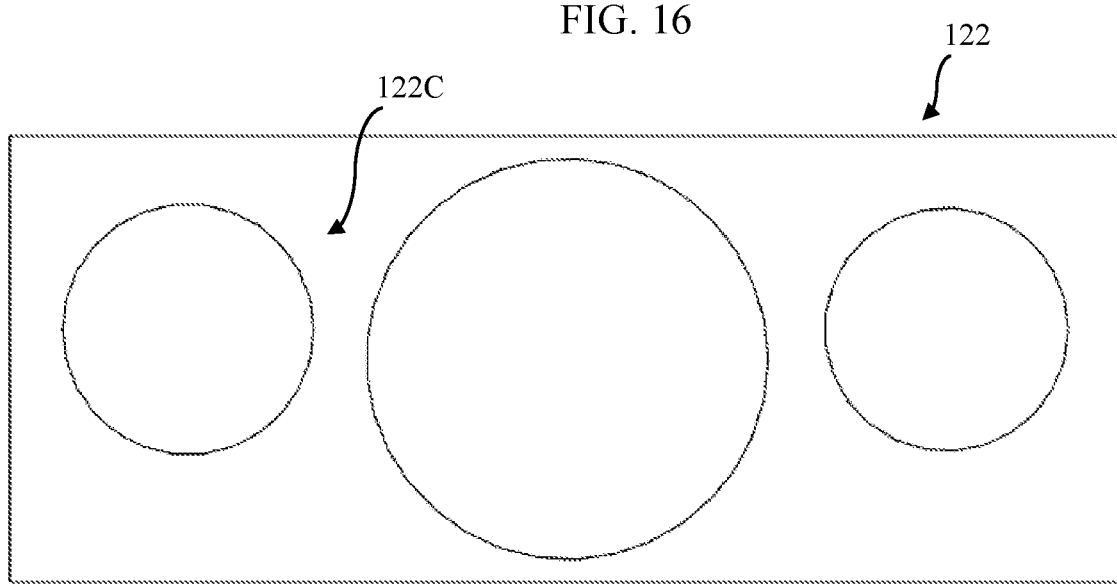
Figure 18:
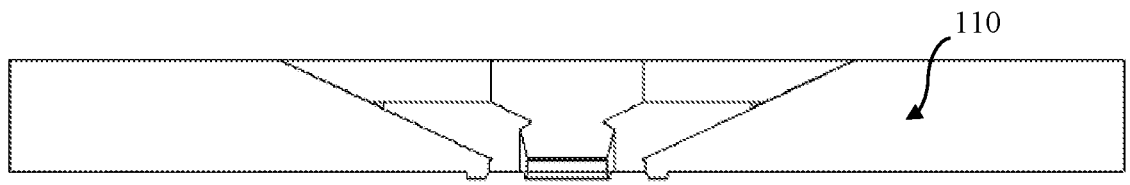
Figure 19:
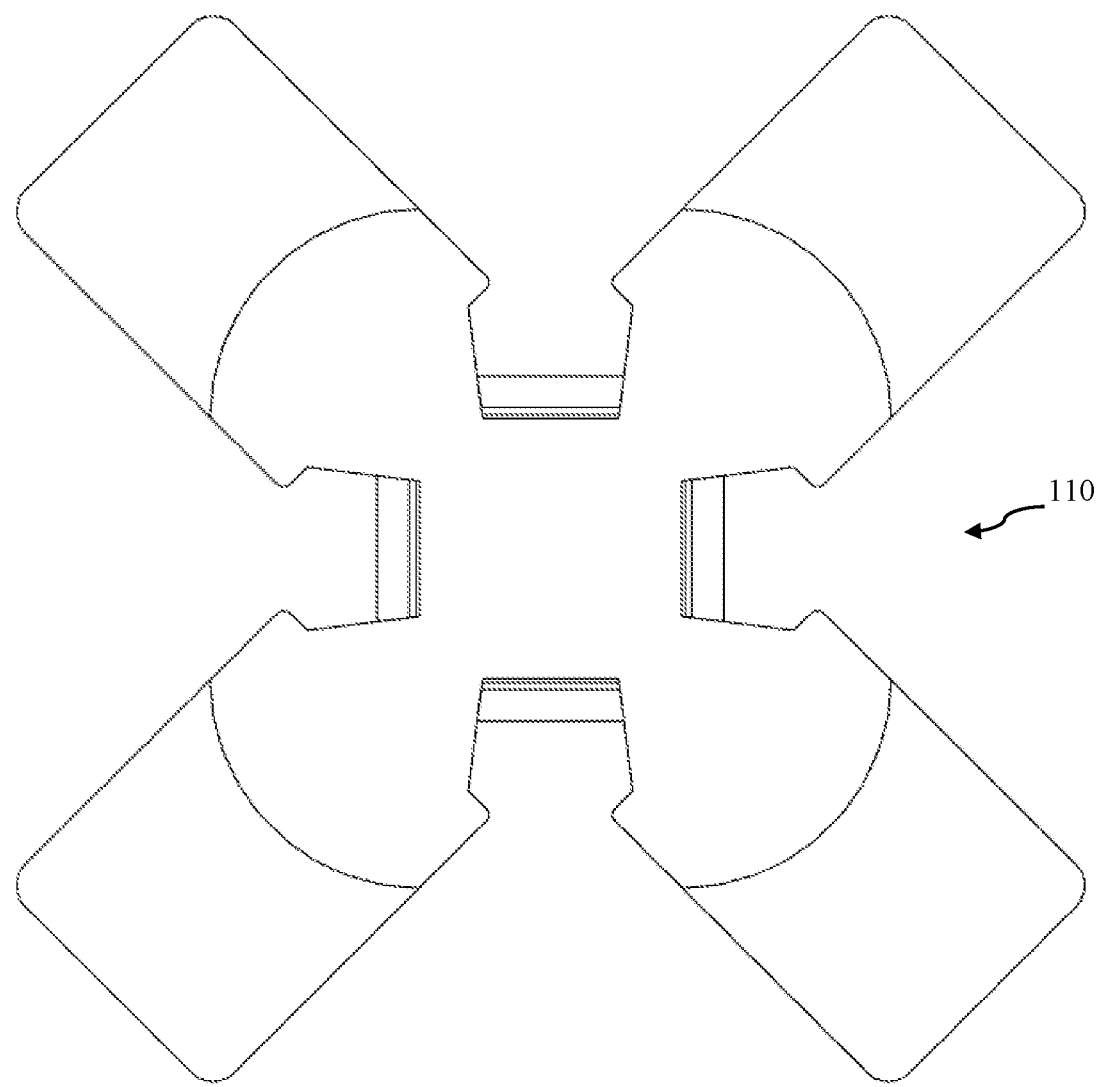
Figure 20:
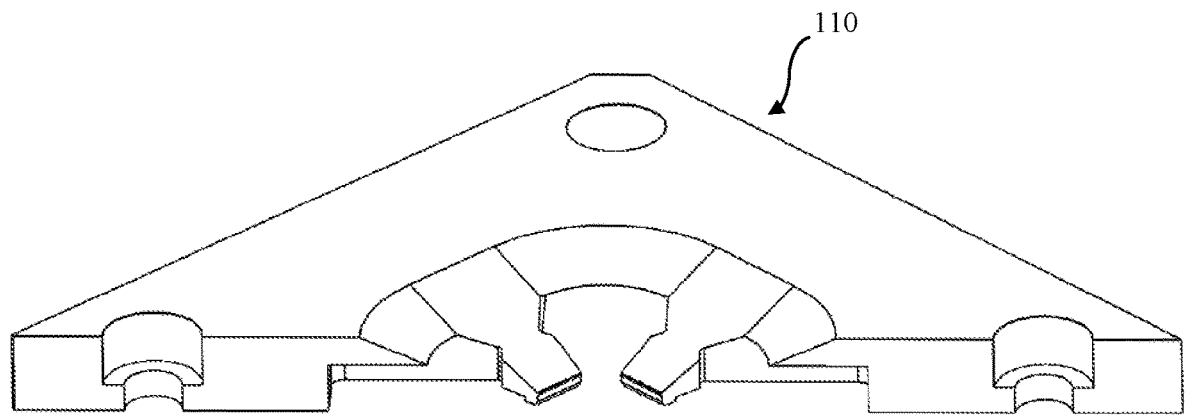
Figure 21:
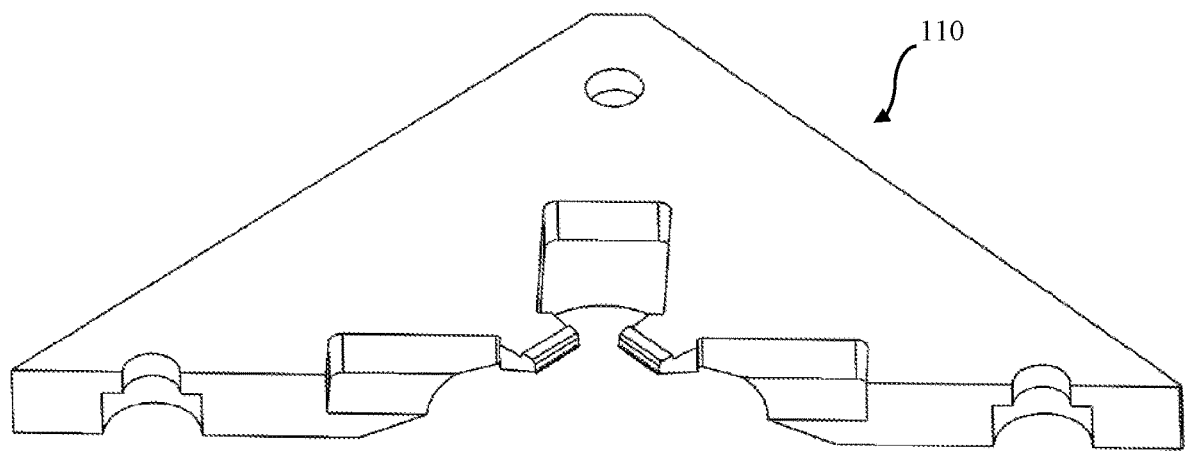
Figure 22A:
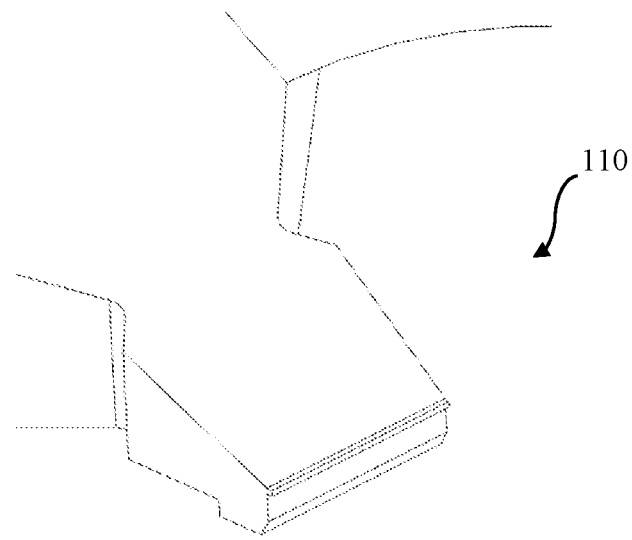
Figure 22B:
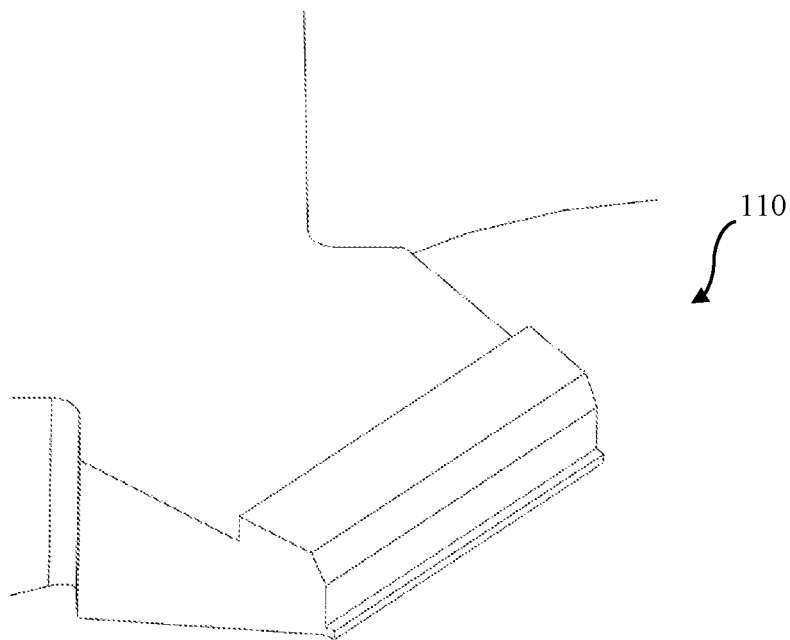
Figure 23:
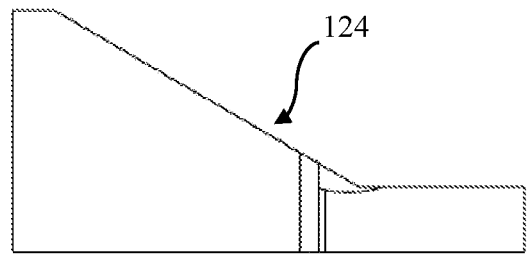
Figure 24:
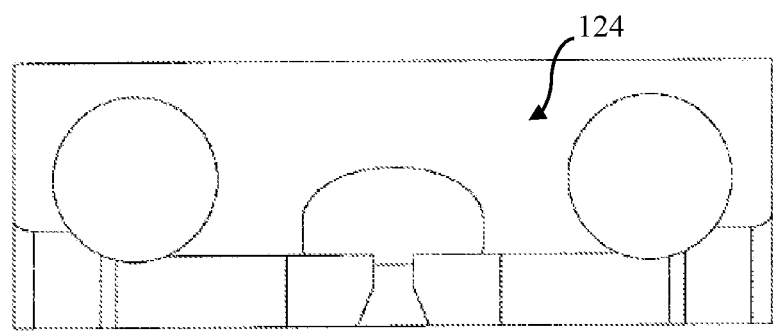
Figure 25:
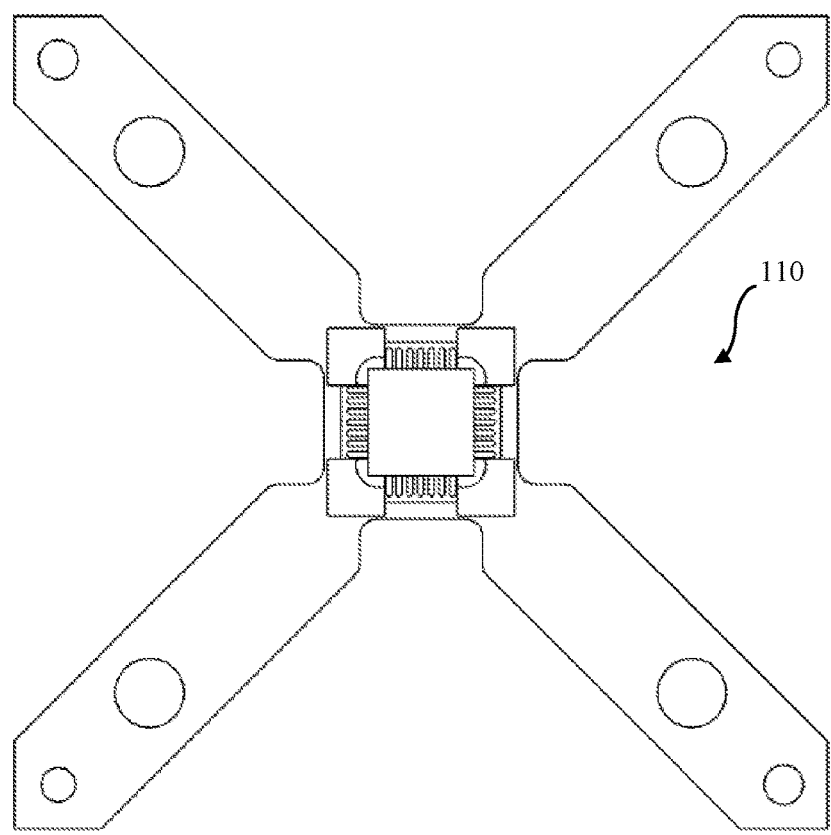
Figure 26:
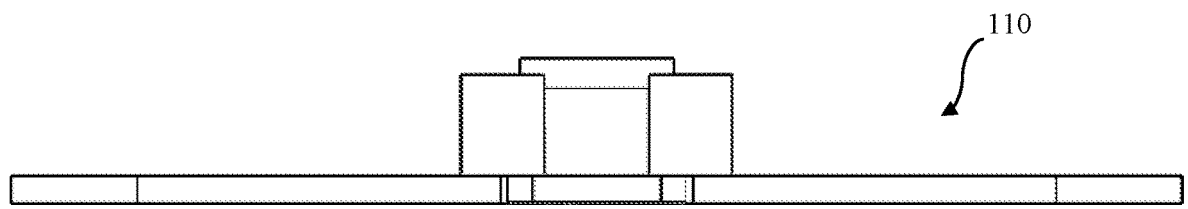
Figure 27A:
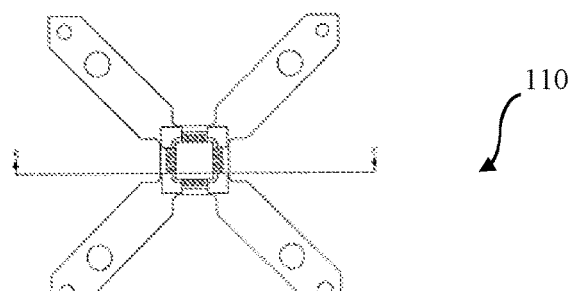
Figure 27B:
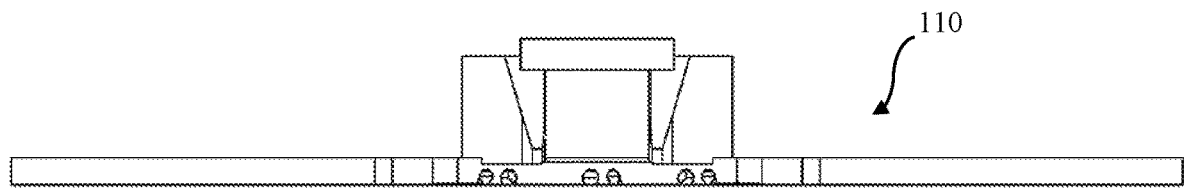
Figure 28A:
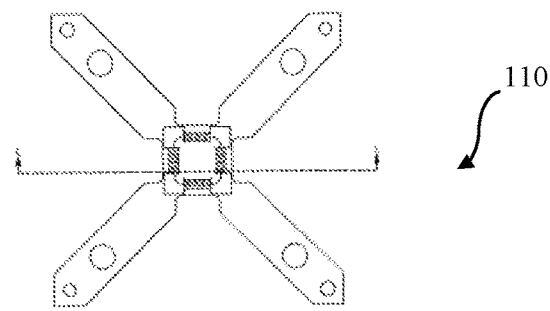
Figure 28B:
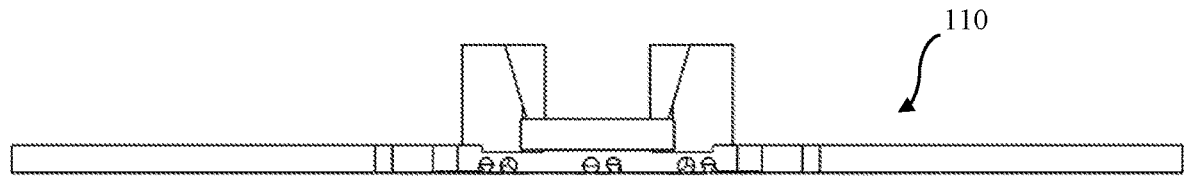
Figure 29:
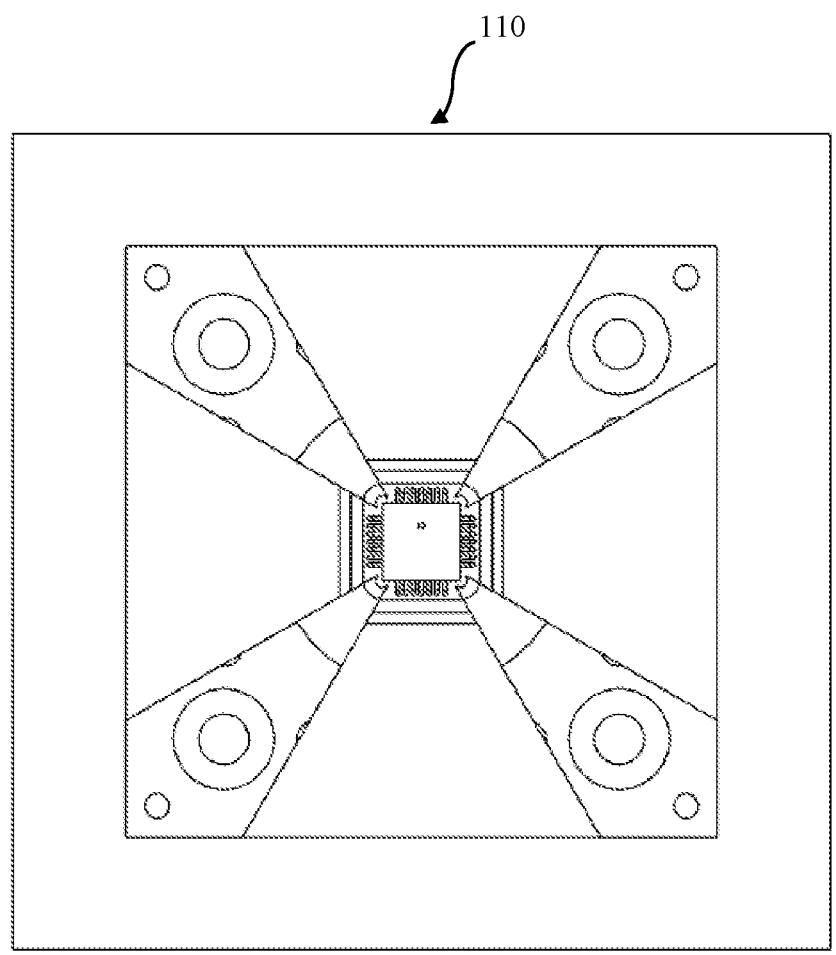
Figure 30A:
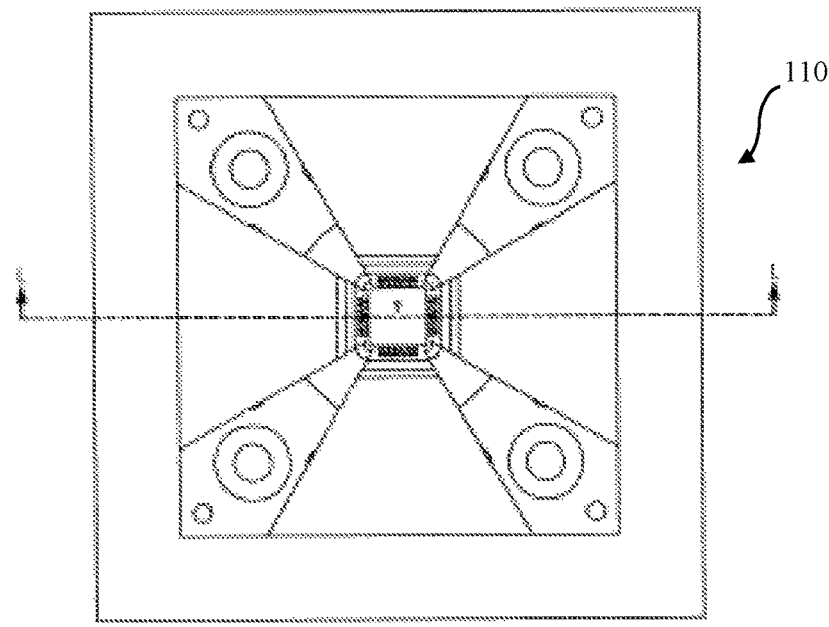
Figure 30B:
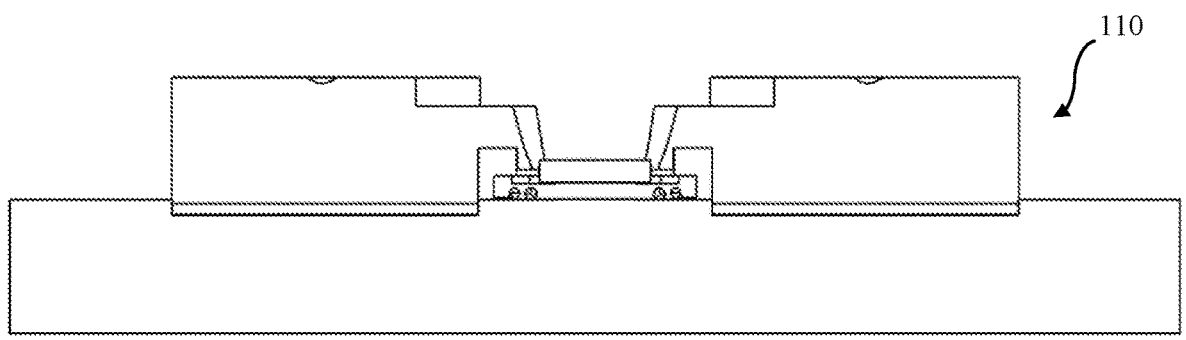
Figure 31A:
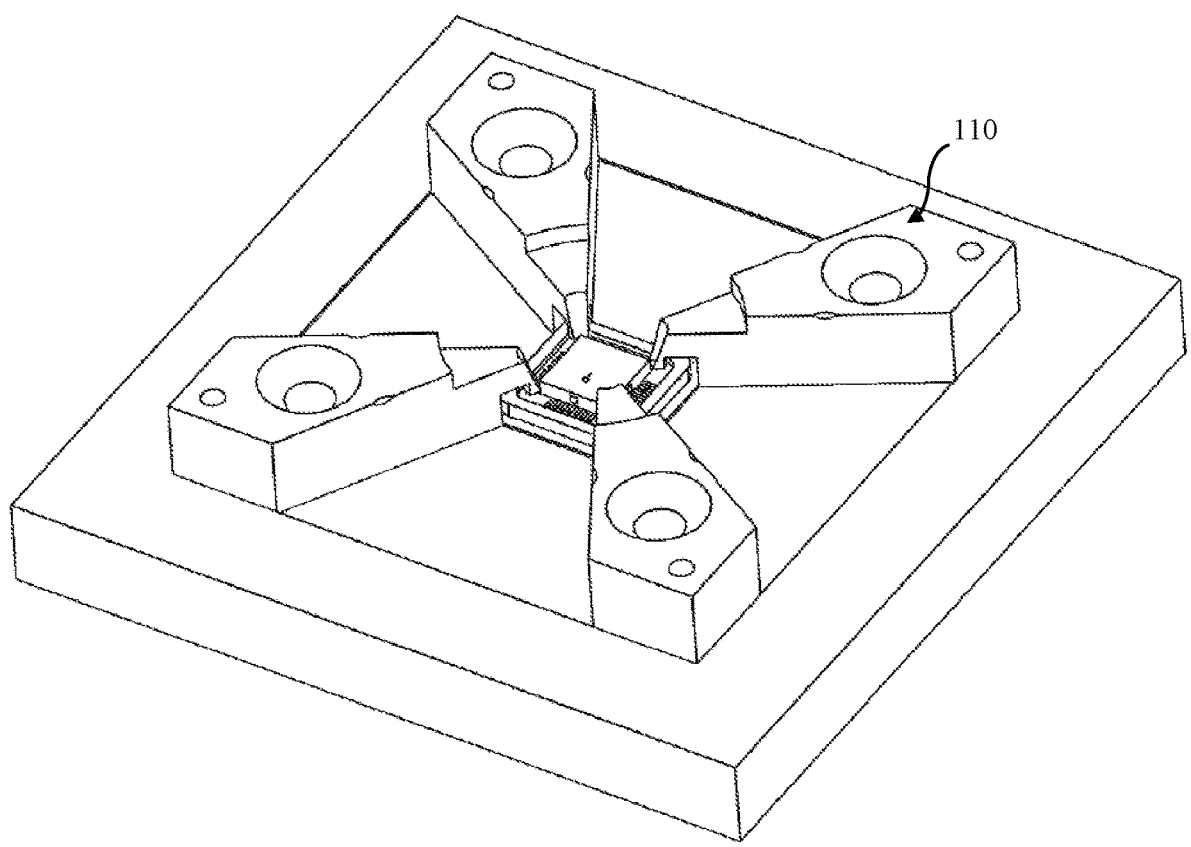
Figure 31B:
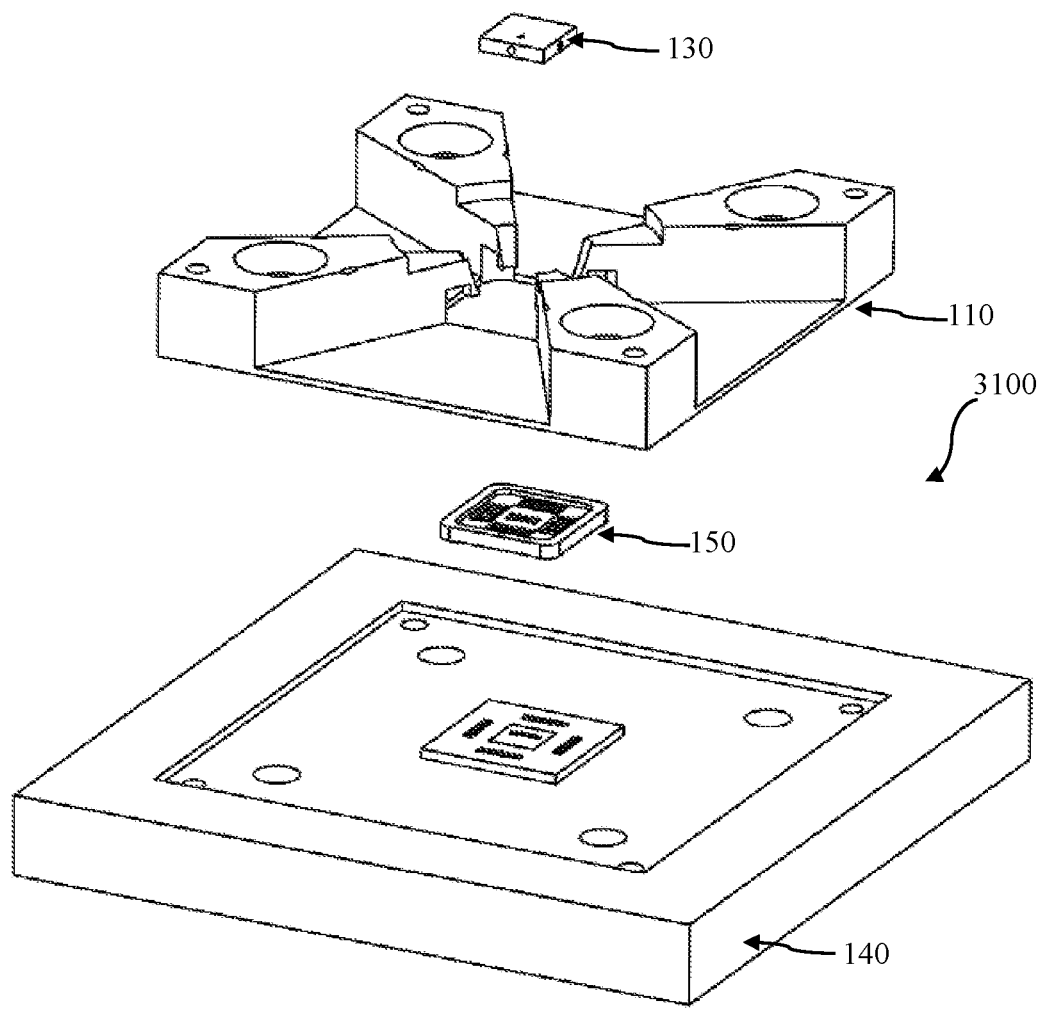
Figure 31C:
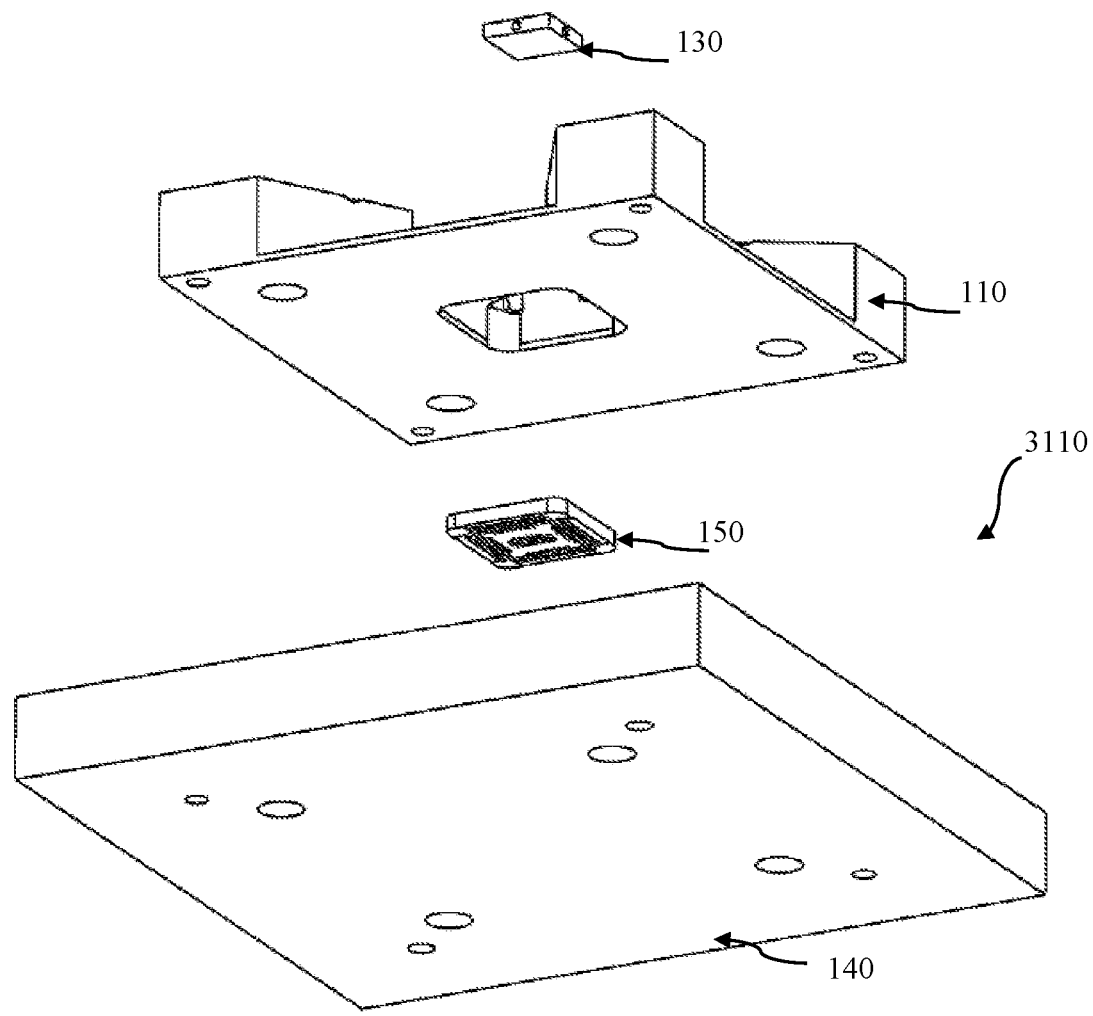
Figure 32:
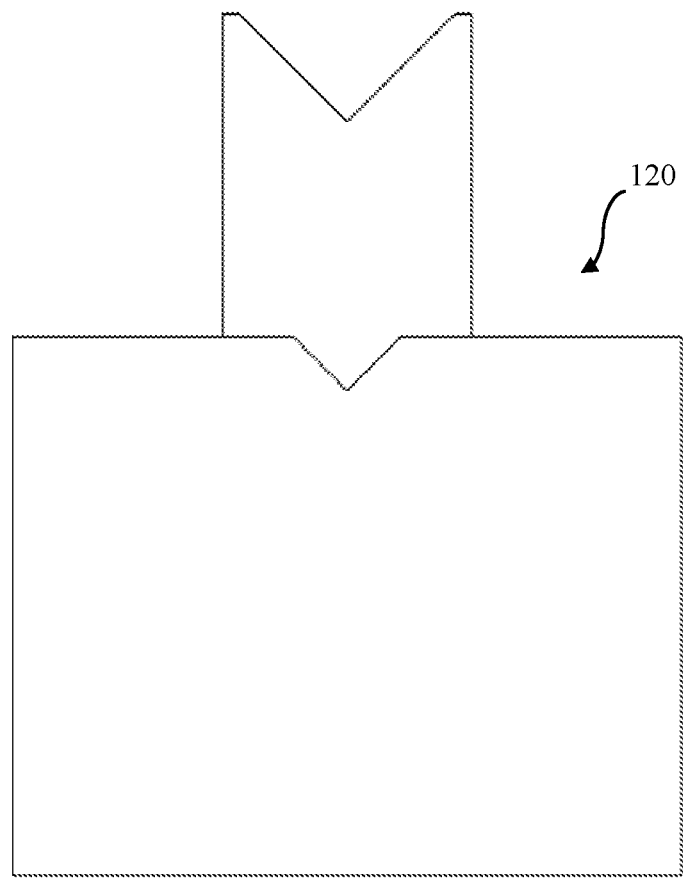
Figure 33:
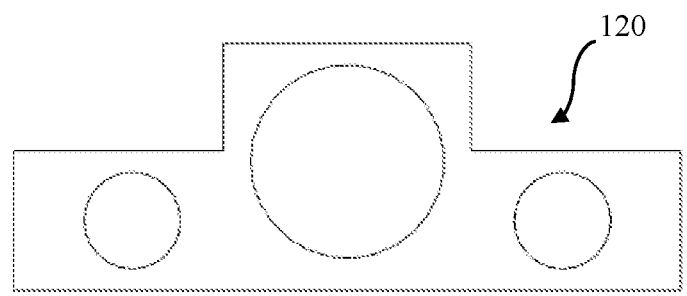
Figure 34:
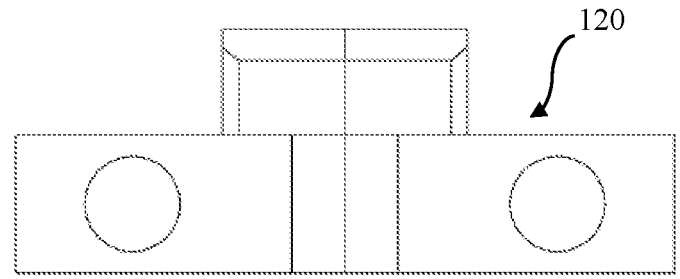
Figure 35:
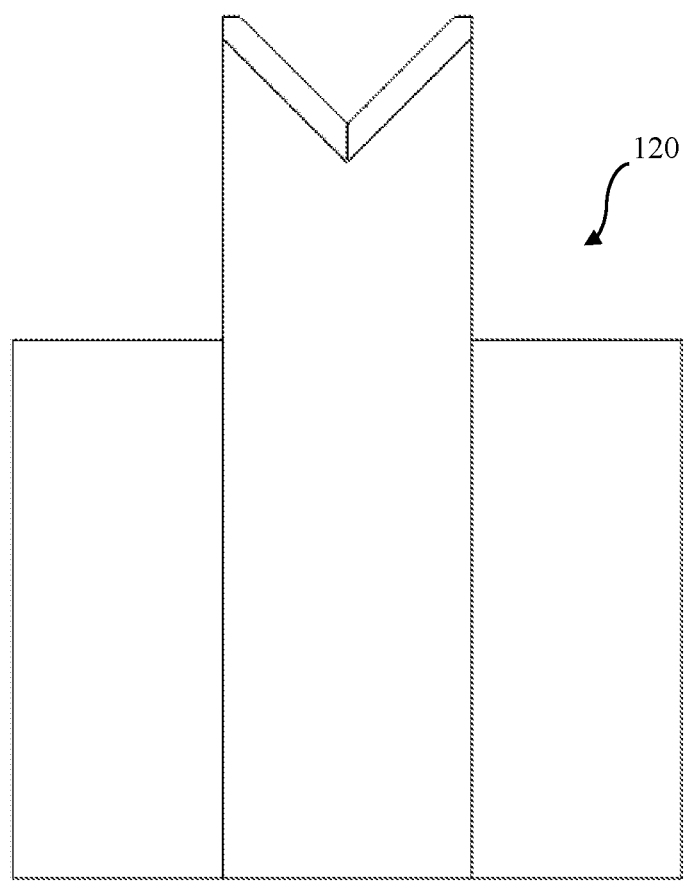
Figure 36A:
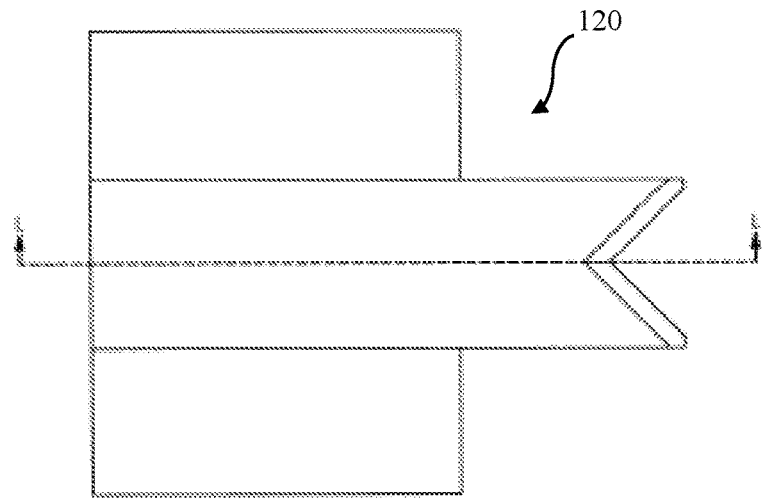
Figure 36B:
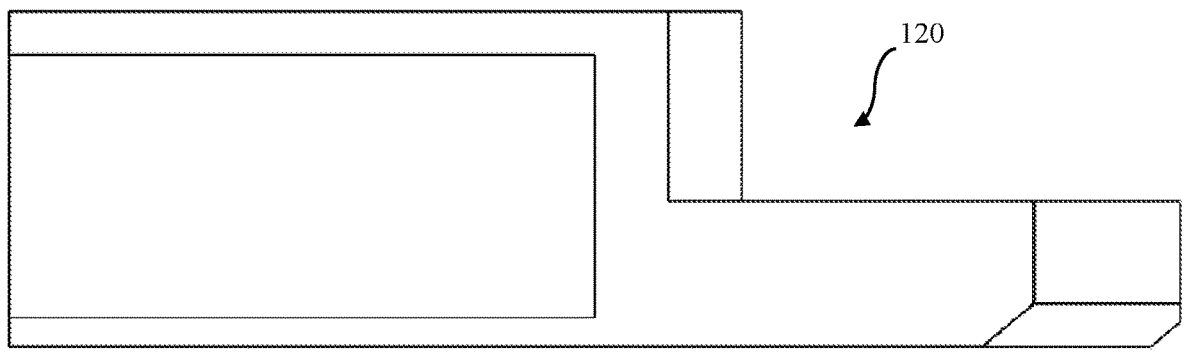
Figure 37:
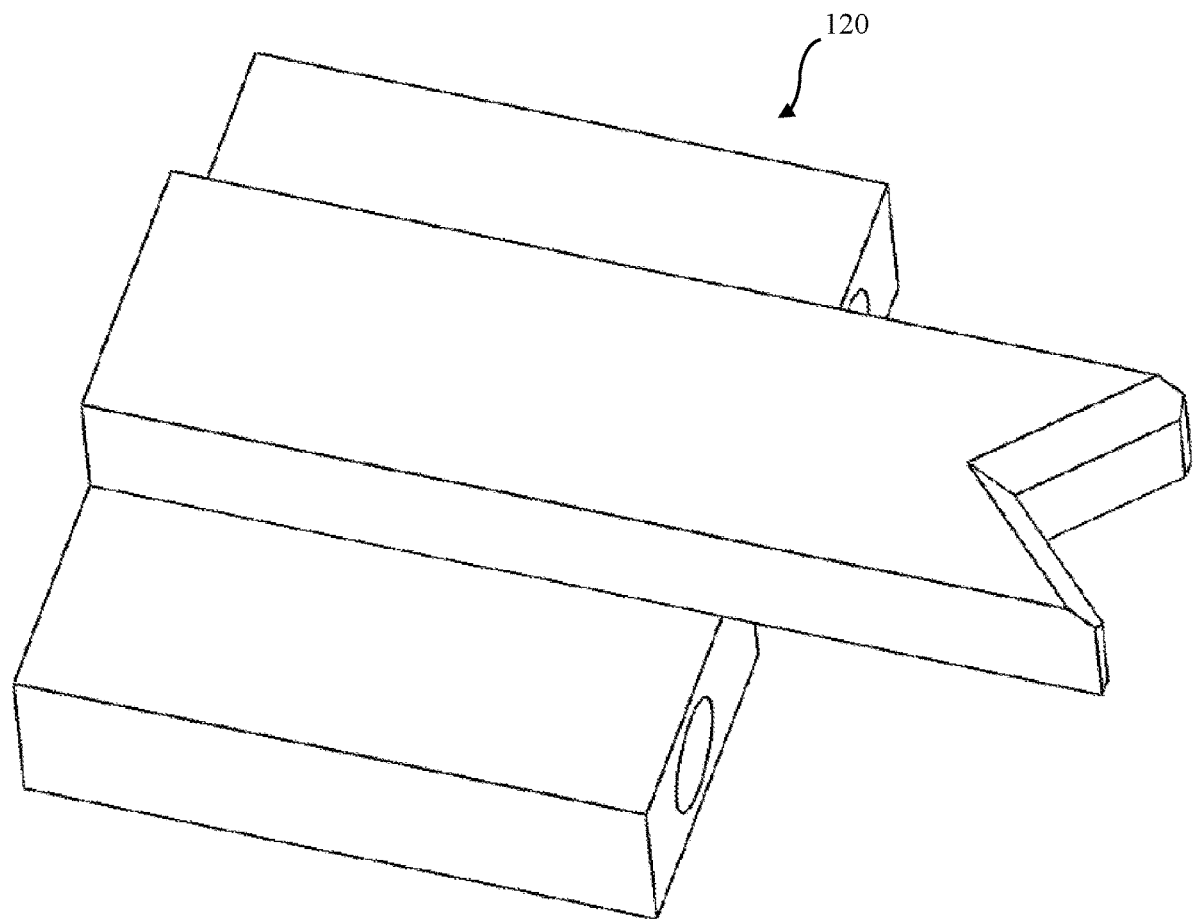
Figure 38:
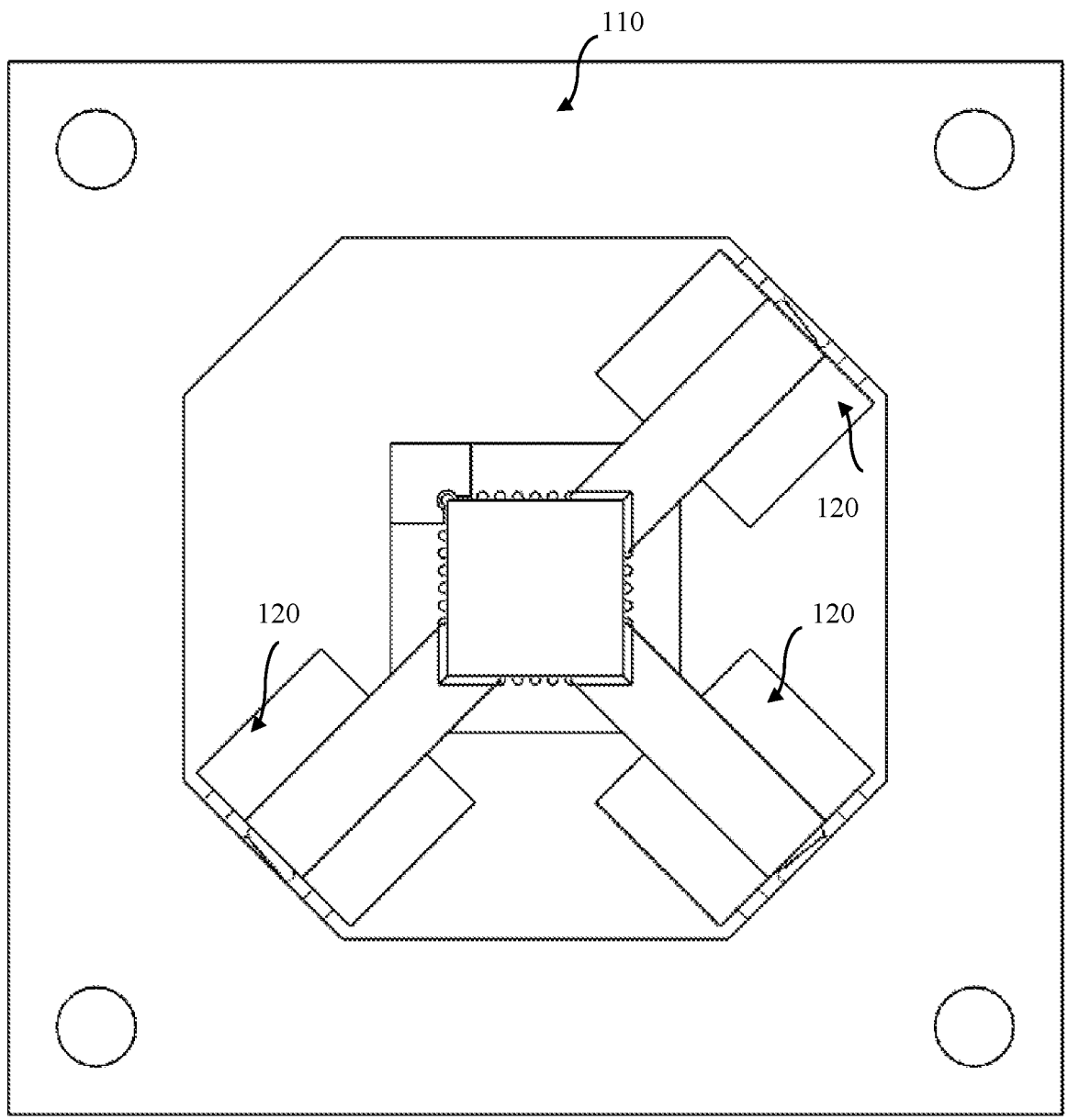
Figure 39:
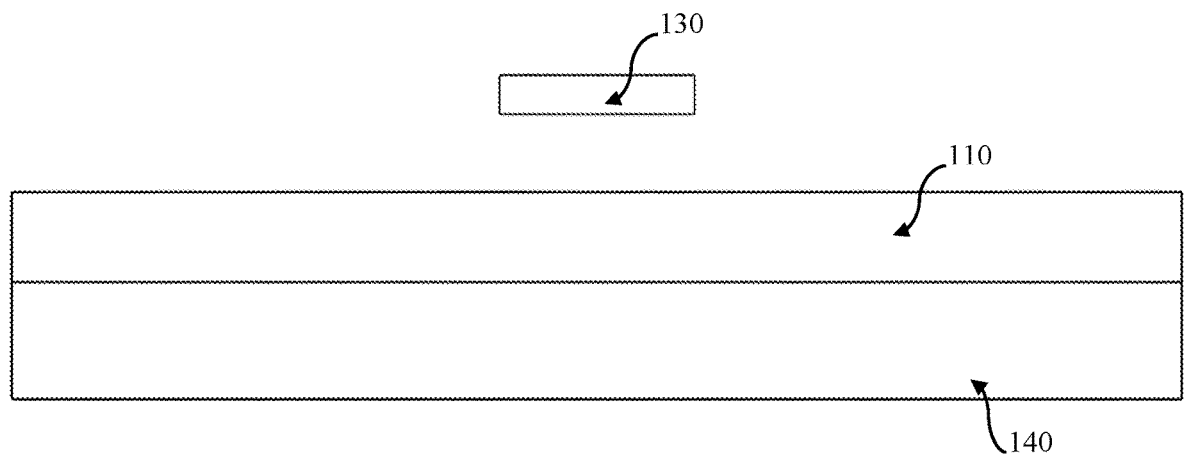
Figure 40:
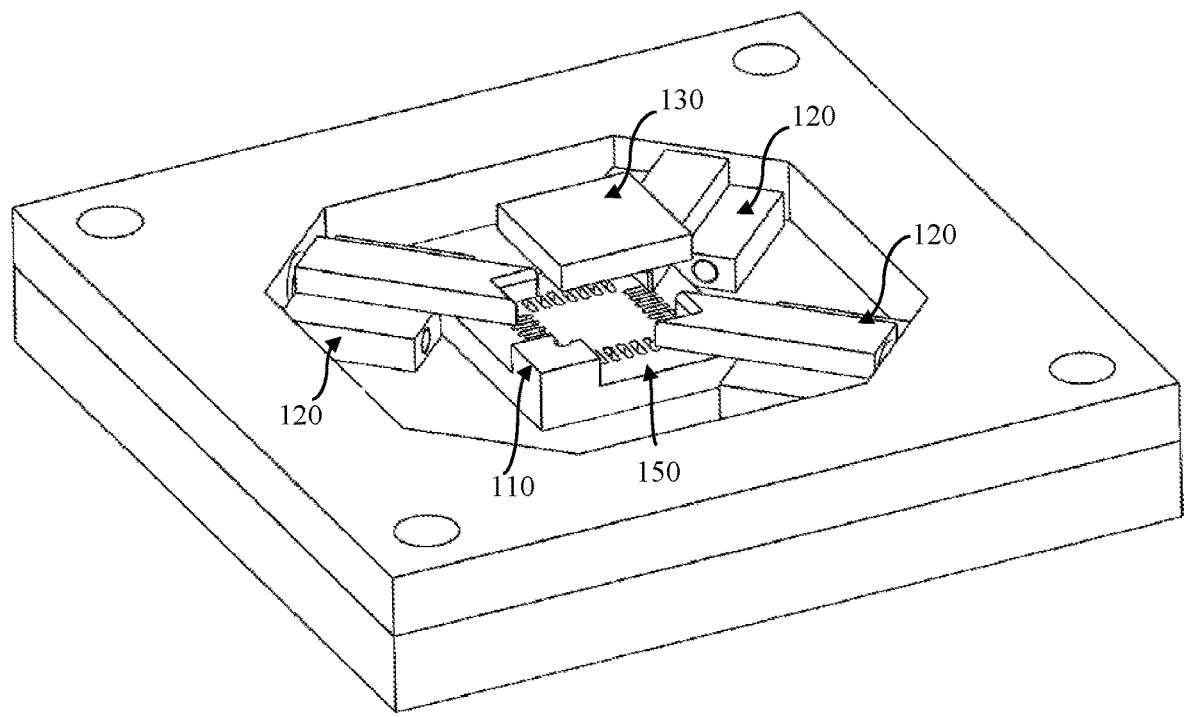
Figure 41:
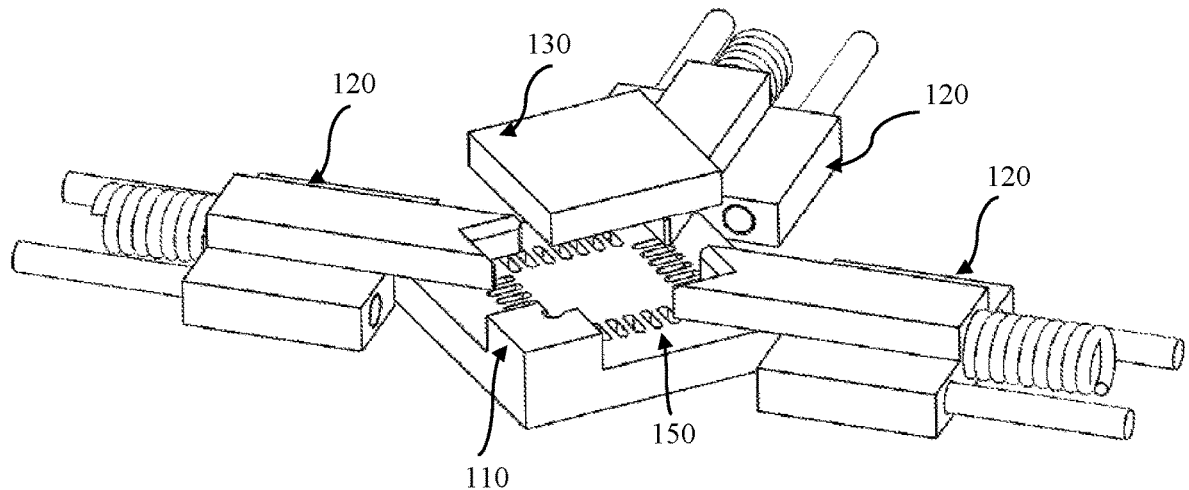
Figure 42:
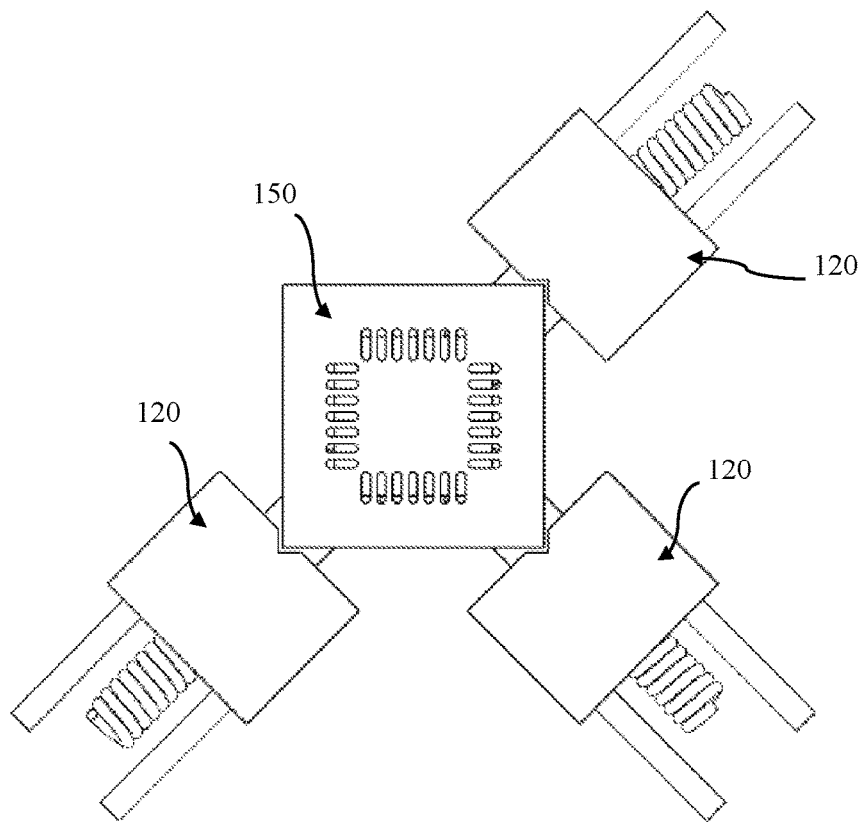
Figure 43:
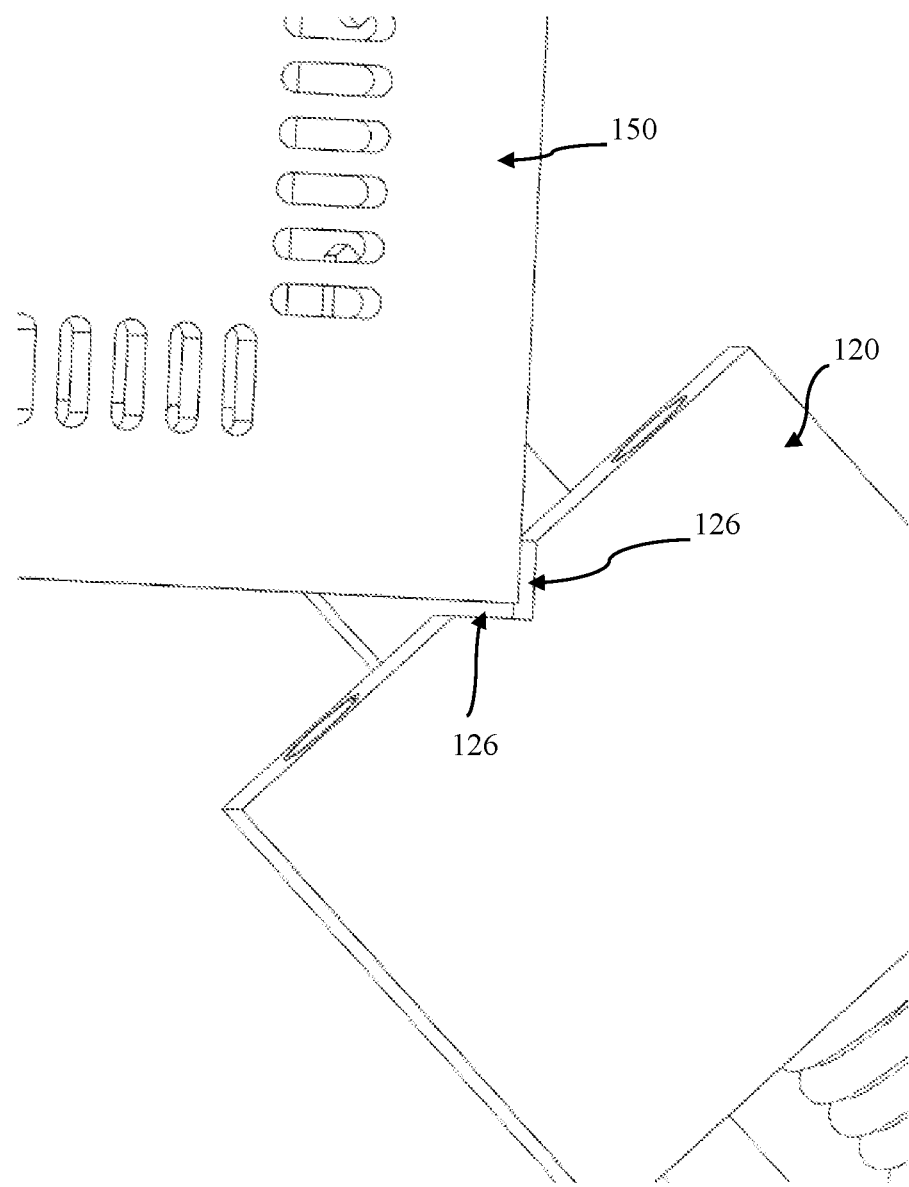
Figure 44A:
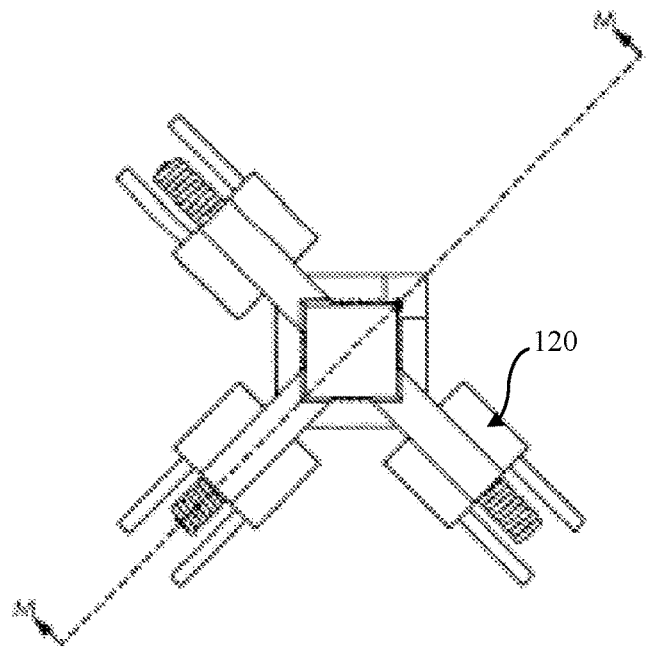
Figure 44B:
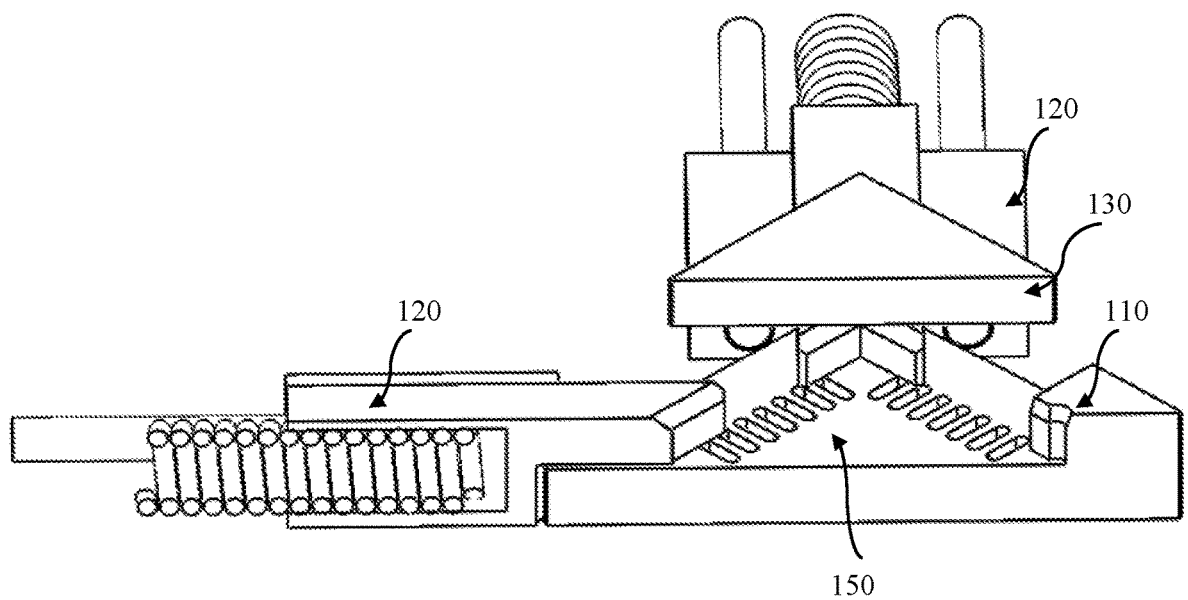

FIGS. 12-44B show various embodiments of the various building blocks of the testing system. FIG. 12 shows a bottom view of an alignment plate 110 with four gripper assemblies 120. In FIG. 12, each gripper assembly 120 can be prevented from moving too close to the DUT 130 (with antennas 132 on top surface 130A) by the horizontal stops 126 (see the gaps between the edges of the gripper assembly 120 and the edges of the aligner 116) on the x-y plane on the alignment plate 110. FIG. 13 shows a top view of an alignment plate 110 with four gripper assemblies, each assembly being capable of articulating as previously explained. It is also contemplated that 1, 2, 3, or 4 grippers may be movable or fixed. FIG. 14 shows another embodiment of an alignment plate 110 having integrated gripper assemblies holding a DUT 130 (with antennas 132). FIGS. 15 and 16 show exploded views (1500, 1600) of FIG. 12. Note that the grippers have separated contact surfaces with a gap therebetween. A close up of the separated gripper members and contact services are shown in FIG. 22A/22B. FIG. 17 shows another embodiment of a base 122. FIGS. 18-22B show some other embodiments/views of an alignment plate 110 with integrated gripper assemblies. FIGS. 23 and 24 show other embodiments/views of an extender 124. FIGS. 25-28B show some other embodiments/views of a one-piece alignment plate and contactor 110 holding a DUT (the alignment plate and the contactor are integrated together rather than being separate parts). FIGS. 29-31A show some other embodiments/views of an alignment plate 110 on a load board holding a DUT in a configuration that provides additional clearance for antennas on the sides of the DUT. The figures do not show moving grippers in FIGS. 29-31, but it will be appreciated that some or all of the alignment features shown can be configured as moving grippers. FIGS. 31B and 31C show exploded views (3100, 3110) of FIG. 31A. FIGS. 32-37 show some other embodiments/views of a single-piece gripper 120. FIGS. 38-40 show some other embodiments/views of an alignment plate 110 on a load board 140 with gripper assemblies 120 holding a DUT 130. FIGS. 41-44B show some other embodiments/views of gripper assemblies 120 holding a DUT 130 including a bias spring to drive the grippers into the DUT 130 corner, and the cylindrical which the base member slides on. FIG. 42 is a view of the same/similar embodiment as FIGS. 41-44B but shown from the bottom (load board side) perspective. In such view the grippers 120 can be designed to have an inner stop feature 126 that uses the corners of the contactor to prevent the grippers 120 from moving too far inward. The inner stop feature 126 performs the same/similar function as 126 in FIG. 12. It will be appreciated that this is one potential method of performing this function. FIG. 42 shows a configuration with three (instead of four) corner units with grippers 120. FIG. 44B is a section view showing two grippers 120, one alignment feature 110 that is manufactured as part of the contactor 150, and a DUT 130 floating above the assembly.

It will also be appreciated that the contactor housing can have alignment features (aligner(s)) built directly into it. Such design can be used with a lead backer (handler, or handler nest, etc.) that incorporates antenna(s) to receive the RF signal from the DUT, or clearances to avoid disturbing the RF signal, or made from a material that is transparent to the RF signal.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, indicate the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts, without departing from the scope of the present disclosure. The word "embodiment" as used within this specification may, but does not necessarily, refer to the same embodiment. This specification and the embodiments described are examples only. Other and further embodiments may be devised without departing from the basic scope thereof, with the true scope and spirit of the disclosure being indicated by the claims that follow.

We claim:

1. A test apparatus for testing device under test (DUT) having at least one antenna located on the DUT, comprising:
    a socket configured to electrically connect the DUT to a load board;
    a gripper assembly configured to hold the DUT in place;
    a retractor configured to release the DUT from the gripper assembly; and
    an alignment plate configured to align the DUT with the socket;
    wherein the gripper assembly includes a base and an extender, the extender is configured to hold the DUT in place, the extender includes a pair of protrusions, tips of the respective protrusions are spaced apart from each other,
    when the retractor is disengaged from the extender, the protrusions of the extender are configured to exert lateral force on the DUT to hold the DUT in place, and
    when the retractor is engaged with the extender, the extender is configured to release the DUT on the alignment plate.

2. The test apparatus of claim 1, wherein the gripper assembly further includes an elastic member, the elastic member provides a bias force against the gripper assembly to engage the DUT.

3. The test apparatus of claim 2, wherein the elastic member is a pneumatic member configured to move the gripper assembly upon command.

4. The test apparatus of claim 1, wherein the retractor includes one or more retractors configured to release the DUT from the gripper assembly.

5. The test apparatus of claim 1, wherein the gripper assembly includes a recess, the recess is configured to fit the DUT into the recess.

6. The test apparatus of claim 1, wherein the alignment plate includes a horizontal stop, the horizontal stop being configured block the horizontal movement of the extender toward the DUT.

7. The test apparatus of claim 1, wherein the alignment plate includes a vertical stop, the vertical stop is configured to block the vertical movement of the DUT in a direction perpendicular to a top surface of the DUT.

8. The test apparatus of claim 1, further comprising a tester antenna, wherein the antenna of the DUT is disposed on a top surface of the DUT, the tester antenna is spaced away from the antenna of the DUT in a direction perpendicular to the top surface of the DUT.

9. The test apparatus of claim 1, further comprising a tester antenna, wherein the antenna of the DUT is disposed on a side surface of the DUT, the tester antenna is spaced away from the antenna of the DUT in a direction parallel to the top surface of the DUT.

10. The test apparatus of claim 1, wherein the retractor is sized to engage the gripper assembly to retract the gripper assembly from the DUT.

11. The test apparatus of claim 10, wherein the retractor is a pin having a tapered end, the gripper assembly includes an aperture configured to engage with the pin.

12. The test apparatus of claim 1, wherein the alignment plate includes an opening with a lead-in chamfer, the opening of the alignment plate is configured to at least partially house the DUT.

13. The test apparatus of claim 2, wherein the elastic member extends laterally from the base to the extender.

14. The test apparatus of claim 13, wherein the gripper assembly further includes a pair of pins extends from the base to the extender, the elastic member is disposed between the pins.

15. A system for testing device under test (DUT), comprising:
 a test apparatus, the test apparatus including:
  a socket configured to electrically connect the DUT to a load board;
  a gripper assembly configured to hold the DUT in place;
  a retractor configured to release the DUT from the gripper assembly; and
  an alignment plate configured to align the DUT with the socket;
  wherein the gripper assembly includes a base and an extender, and the extender is configured to hold the DUT in place, the extender includes a pair of protrusions, tips of the respective protrusions are spaced apart from each other,
  when the retractor is disengaged from the extender, the protrusions of the extender are configured to exert lateral force on the DUT to hold the DUT in place, and
  when the retractor is engaged with the extender, the extender is configured to release the DUT on the alignment plate.

16. The system of claim 15, wherein the gripper assembly further includes an elastic member, the elastic member provides a bias force against the gripper assembly to engage the DUT.

17. The system of claim 15, wherein the extender includes a recess, the recess is configured to fit the DUT into the recess.

18. The system of claim 15, wherein the alignment plate includes a horizontal plane stop, the plane stop is configured block the movement of the extender toward the DUT.

19. The system of claim 16, wherein the alignment plate includes a vertical stop, the vertical stop is configured to block the movement of the DUT in a direction perpendicular to a top surface of the DUT.

20. A test apparatus for testing device under test (DUT), the DUT having at least one antenna located on the DUT and having at least four sidewalls forming at least four corners at adjacent sidewalls, comprising:
 a socket having at least four corners, configured to electrically connect the DUT to a load board;
 a gripper assembly configured to resiliently engage at least one corner of the DUT, the gripper assembly including at least one corner engaging element and a bias element;
 a retractor configured to release the DUT from the gripper assembly by withdrawing the gripper assembly from contacting with the DUT; and
 an alignment plate configured to align the DUT with the socket;
 wherein the gripper assembly includes at least one base portion and an extender, the extender includes a pair of protrusions, tips of the respective protrusions are spaced apart from each other, the protrusions of the extender are configured to exert lateral force on the DUT to hold the DUT in place, and the extender includes an aperture between the protrusions;
 the retractor includes a pin sized to be receivable within the aperture for retracting the gripper assembly;
 when the retractor is disengaged from the extender, the extender is configured to hold the DUT in place, and
 when the retractor is engaged with the extender, the extender is configured to release the DUT on the alignment plate.

* * * * *